(12) United States Patent
Park

(10) Patent No.: US 8,164,954 B2
(45) Date of Patent: Apr. 24, 2012

(54) FLASH MEMORY DEVICE AND PROGRAM METHOD THEREOF

(75) Inventor: Jin-Sung Park, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/224,101

(22) Filed: Sep. 1, 2011

(65) Prior Publication Data

US 2011/0310668 A1    Dec. 22, 2011

Related U.S. Application Data

(63) Continuation of application No. 12/482,590, filed on Jun. 11, 2009, which is a continuation-in-part of application No. 12/100,490, filed on Apr. 10, 2008, now Pat. No. 8,031,525.

(30) Foreign Application Priority Data

Apr. 23, 2007   (KR) .................. 10-2007-0039417

(51) Int. Cl.
    *G11C 11/34* (2006.01)
(52) U.S. Cl. .................. 365/185.14; 365/200; 365/202
(58) Field of Classification Search ............. 365/185.17, 365/200, 202
    See application file for complete search history.

(56) References Cited

U.S. PATENT DOCUMENTS 6,717,858 B2    4/2004   Kawai et al.
2006/0171202 A1*  8/2006  Kawamoto et al. ...... 365/185.17
* cited by examiner

*Primary Examiner* — Jason Lappas
(74) *Attorney, Agent, or Firm* — F. Chau & Associates, LLC

(57) ABSTRACT

A nonvolatile memory device that includes first and second storage areas, and a control logic configured to control the first and second storage areas, wherein when a program operation of the first storage area is passed before a program operation of the second storage area is passed, the control logic completes the program operation of the first storage area and continues the program operation of the second storage area is provided.

9 Claims, 20 Drawing Sheets

FLASH MEMORY DEVICE AND PROGRAM METHOD THEREOF

CROSS-REFERENCE TO RELATED APPLICATIONS

This U.S. non-provisional patent application is a continuation of U.S. patent application Ser. No. 12/482,590, filed Jun. 11, 2009, which is a continuation-in-part of U.S. patent application Ser. No. 12/100,490 filed Apr. 10, 2008 now U.S. Pat. No. 8,031,525, which claims priority under 35 U.S.C. §119 to Korean Patent Application No. 10-2007-0039417 filed on Apr. 23, 2007, the entire contents of which are hereby incorporated by reference.

BACKGROUND

The present disclosure relates to a flash memory device and, more particularly, to a flash memory device and a program method capable of reducing program disturbance.

A non-volatile memory device may retain stored data in memory cells even when the power is turned off. As an example of such a non-volatile memory device, a flash memory device may have a function of electrically erasing data of memory cells collectively, so that it is widely used for applications such as computers, memory cards, and the like.

A flash memory device may be classified into a NOR type and a NAND type based upon the interconnection between memory cells and bit lines. In general, the NOR-type flash memory device is unfavorable for high integration, although it has an advantage that it can easily cope with high speed. The NAND-type flash memory device is favorable for high integration, because it consumes less current than the NOR-type flash memory device.

The NAND-type flash memory device may include a memory cell array as a region for storing information. The memory cell array may consist of a plurality of blocks, each of which has a plurality of cell strings (referred to as NAND strings). The NAND-type flash memory device may further include a page buffer circuit that is configured to store or read data in or from the memory cell array. As is known in the art, in the case of the NAND-type flash memory device, memory cells may be programmed or erased by use of the Fowler-Nordheim (FN) tunneling current. Erase and program methods of the NAND-type flash memory device are disclosed in greater detail in U.S. Pat. No. 5,473,563 entitled "Nonvolatile Semiconductor Memory" and in U.S. Pat. No. 5,696,717 entitled "Nonvolatile Integrated Circuit Memory Devices Having Adjustable Erase/Program Threshold Voltage Verification Capability", the entire contents of which are hereby incorporated by reference.

The NAND-type flash memory device may be classified into a Single Level Cell (SLC) NAND-type flash memory device and a Multi Level Cell (MLC) NAND-type flash memory device.

The SLC NAND-type flash memory device can store 1-bit data per memory cell, while the MLC NAND-type flash memory device can store multi-bit data per memory cell.

FIG. 1 is a diagram showing threshold voltage distributions of a conventional MLC NAND-type flash memory device. The distribution figure indicates the case that 2-bit data is stored in each memory cell of the MLC NAND-type flash memory device. It will be understood by one of ordinary skill in the art, however, that the MLC NAND-type flash memory device is configured to store N-bit data (N is an integer of 3 or more) per memory cell.

Referring to FIG. 1, when erased, a memory cell may have an erase state ST0. Further, each memory cell may be programmed to have one of program states (or, data states) ST1, ST2 and ST3. Although not illustrated, in a case where 3-bit data is stored in each memory cell, each memory cell may have one of an erase state (ST0) and seven program states (ST1~ST7).

A conventional NAND-type flash memory device may include a plurality of planes, each of which has a separate memory cell array. A memory cell array may include memory cells arranged in rows and columns. During a multi-plane program operation, the NAND-type flash memory device may perform a program operation with respect to all or selected planes at the same time. In this case, the NAND-type flash memory device may perform a verification operation for confirming whether a program operation of each plane is made in the normal fashion. A program operation is passed when data is programmed normally and is failed when data is not programmed normally. As is known in the art, the NAND-type flash memory device may repeat a program operation until the program operations all of the selected planes are passed.

Although a program-passed plane exists, the NAND-type flash memory device may perform a program operation with respect to all selected planes when at least one plane is judged to be program-failed. During the repeated program operation, a program voltage and a pass voltage are applied to all selected planes that consist of program-passed planes and program-failed planes. Accordingly, if the NAND-type flash memory device has at least one program-failed plane, the program and pass voltages may be applied to all selected planes that include program-passed planes.

In this case, memory cells in a program-passed plane may be unnecessarily supplied with the program and pass voltages. That is, memory cells in a program-passed plane may be unduly stressed. Memory cells thus stressed may be soft programmed, as illustrated by the broken lines in FIG. 1. This means that threshold voltages of the memory cells in the program-passed plane are increased, which is illustrated by the broken lines in FIG. 1. In other words, the memory cells in the program-passed plane may suffer from program disturbance.

A NAND-type flash memory device may read data from selected memory cells to output the read data externally. During a read operation, read voltages R0, R1, and R2 defined between ST0 and ST1, between ST2 and ST3, and between ST2 and ST3, respectively, may be used to read 2-bit data. If threshold voltage distributions of respective states are increased over the read voltages R0, R1, and R2, it is impossible to read data from memory cells having the states ST0, ST1, ST2, and ST3 accurately. That is, a read error may arise.

As a result, during a multi-plane program operation, if at least one plane is judged to be program-failed, the program and pass voltages may be continuously applied to memory cells of the program-passed planes. This may cause a read error due to program disturbance.

SUMMARY OF THE INVENTION

Exemplary embodiments of the present invention are directed to provide a flash memory device and a program method thereof capable of reducing program disturbance.

One exemplary embodiment of the present invention provides a nonvolatile memory device that comprises first and second storage areas, and a control logic configured to control the first and second storage areas, wherein when a program operation of the first storage area is passed before a program operation of the second storage area is passed, the control logic completes the program operation of the first storage area and continues the program operation of the second storage area.

An exemplary embodiment of the present invention provides a method of programming a nonvolatile memory device. The method of programming a nonvolatile memory device comprises executing program operations of first and second storage areas simultaneously; completing the program operation of a program-passed area of the first and second storage areas; and continuing the program operation of a program-failed area of the first and second storage areas.

An exemplary embodiment of the present invention provides a memory system that comprises a nonvolatile memory device, and a controller configured to control the nonvolatile memory device. The nonvolatile memory device comprises first and second storage areas, and a control logic configured to control the first and second storage areas, wherein when a program operation of the first storage area is passed before a program operation of the second storage area is passed, the control logic completes the program operation of the first storage area and continues the program operation of the second storage area.

BRIEF DESCRIPTION OF THE FIGURES

Exemplary embodiments of the present invention will be understood in more detail from the following descriptions taken in conjunction with the following figures, wherein like reference numerals refer to like parts throughout the various figures unless otherwise specified. In the figures.

DETAILED DESCRIPTION OF EXEMPLARY EMBODIMENTS

Figure 1:
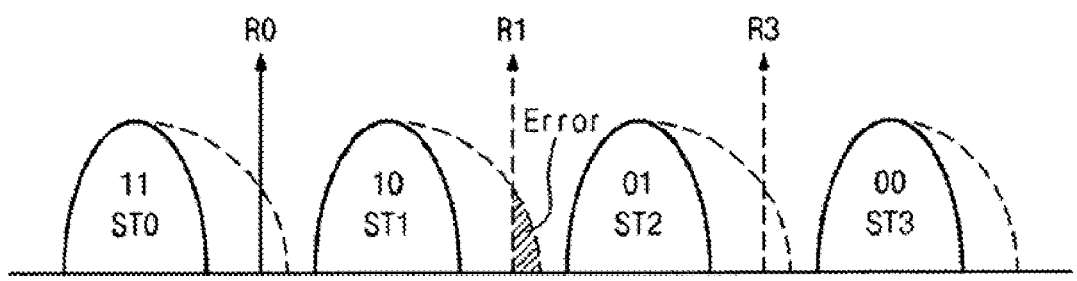
FIG. 1 is a diagram showing threshold voltage distributions of a conventional MLC NAND-type flash memory device.

Exemplary embodiments of the present invention will be described below in more detail with reference to the accompanying drawings, showing a flash memory device as an example for illustrating structural and operational features provided by the present invention. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

As will be described below, a flash memory device according to an exemplary embodiment of the present invention may include a voltage generator circuit configured to generate a program voltage, a pass voltage, and a high voltage; a plurality of planes configured to perform a program operation in response to the program, pass, and high voltages and to verify whether a program operation has passed or failed; and control logic configured to control the planes in response to verification results of the planes. More specifically, the control logic may control the planes so as to prevent the program and pass voltages or the high voltage from being supplied to program-passed planes. Accordingly, the flash memory device of an exemplary embodiment of the present invention is capable of reducing the stress to program-passed planes, that is, reducing a program disturbance.

Figure 2:
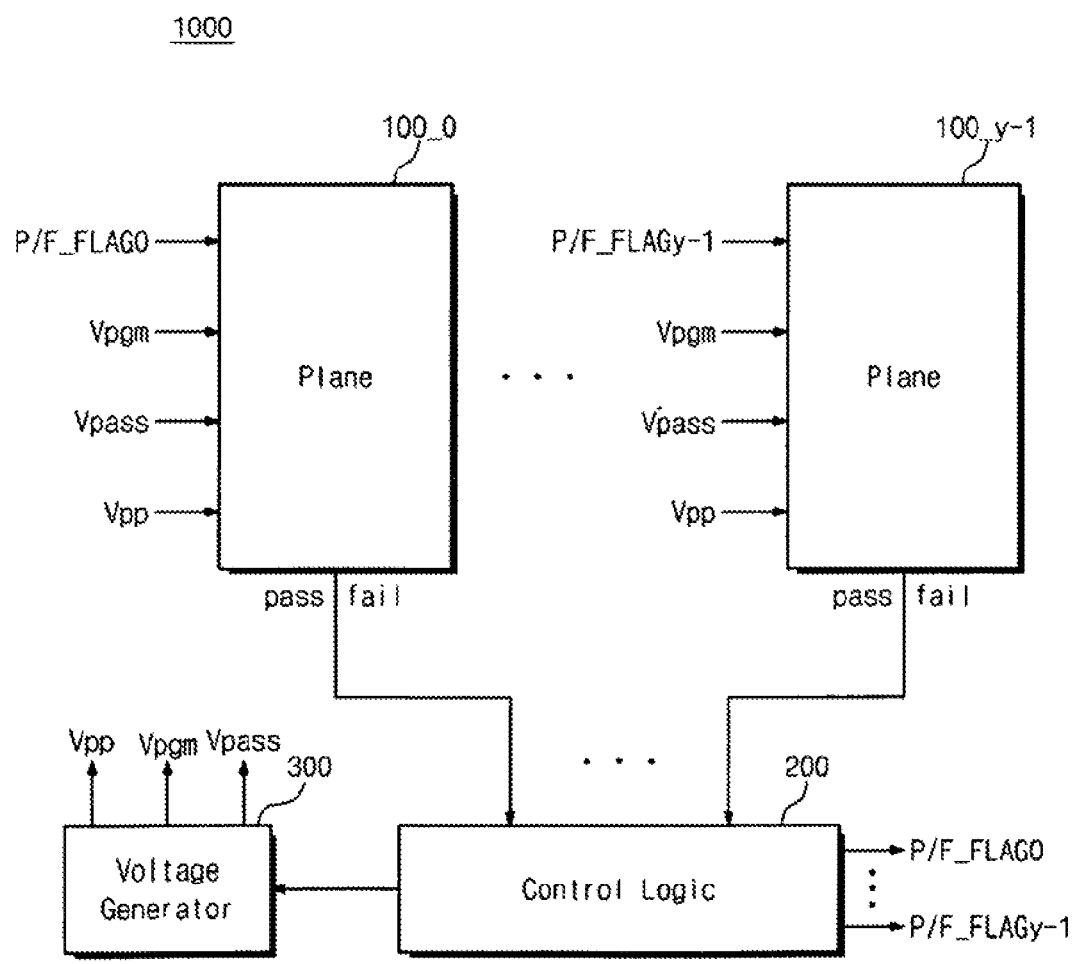
FIG. 2 is a block diagram showing a flash memory device according to an exemplary embodiment of the present invention.

FIG. 2 is a block diagram showing a flash memory device according to an exemplary embodiment of the present invention.

Referring to FIG. 2, a flash memory device 1000 according to an exemplary embodiment of the present invention may include a plurality of planes 100_1 to 100_*y*−1, a control logic unit 200, and a voltage generator circuit 300. The flash memory device 1000 according to this exemplary embodiment of the present invention may be an SLC NAND-type flash memory device or an MLC NAND-type flash memory device.

Each of the planes 100_0 to 100_*y*−1 may be configured to store data information at a multi-plane program operation and to verify whether the data information is stored normally. Verification results of the planes 100_0~100_*y*−1 may be transferred to the control logic 200.

The control logic 200 may be configured to generate control signals P/F_FLAG0~P/F_FLAG*y*−1 each corresponding respectively to the planes 100_0~100_*y*−1 in response to the verification results from the planes 100_0~100_*y*−1. Further, the control logic 200 may be configured to control an entire operation of the flash memory device 1000.

The voltage generator circuit 300 may be configured to generate a program voltage Vpgm, a pass voltage Vpass, and a high voltage Vpp under the control of the control logic 200. The respective program, pass, and high voltages Vpgm, Vpass and Vpp may be supplied to the respective planes 100_0~100_y-1.

In a case where a multi-plane program operation is carried out, the flash memory device 1000 may perform a program operation in which the data information is stored in all or selected ones of the planes. The program operation may be repeated until the data information is stored normally in all or selected ones of the planes. When a program operation of a plane is passed, the plane may output a pass signal. On the other hand, when a program operation of a plane is failed, the plane may output a fail signal. Hereinafter, such a plane that a program operation is passed is referred to as a 'program-passed plane', and such a plane that a program operation is failed is referred to as a 'program-failed plane'.

For example, assuming that a plane 100_0 is program-passed and a plane 100_y-1 is program-failed, the plane 100_0 outputs a pass signal and the plane 100_y-1 outputs a fail signal. The pass and fail signals are supplied to the control logic 200 as verification results. The control logic 200 may activate a control signal P/F_FLAG0 in response to the pass signal from the plane 100_0, and may inactivate a control signal P/F_FLAGy-1 in response to the fail signal from the plane 100_y-1. The control signals P/F_FLAG0 and P/F_FLAGy-1 are fed to the planes 100_0 and 100_y-1, respectively.

The program-passed plane 100_0 may be configured to prevent the program and pass voltages Vpgm and Vpass from being received in response to the activated control signal P/F_FLAG0. Accordingly, no program operation may be made with respect to the program-passed plane 100_0 that receives the activated control signal P//F_FLAG0. On the other hand, the program-failed plane 100_y-1 may receive the program voltage Vpgm and pass voltage Vpass from the voltage generator 300 in response to the inactivated control signal P/F_FLAGy-1. This means that a program operation is repeatedly made with respect to the program-failed plane 100_y-1 that receives the inactivated control signal P/F_FLAGy-1.

As a result, the flash memory device 1000 may be configured to prevent a program operation from being performed with respect to program-passed planes, even though certain planes are not program-passed.

Figure 3:
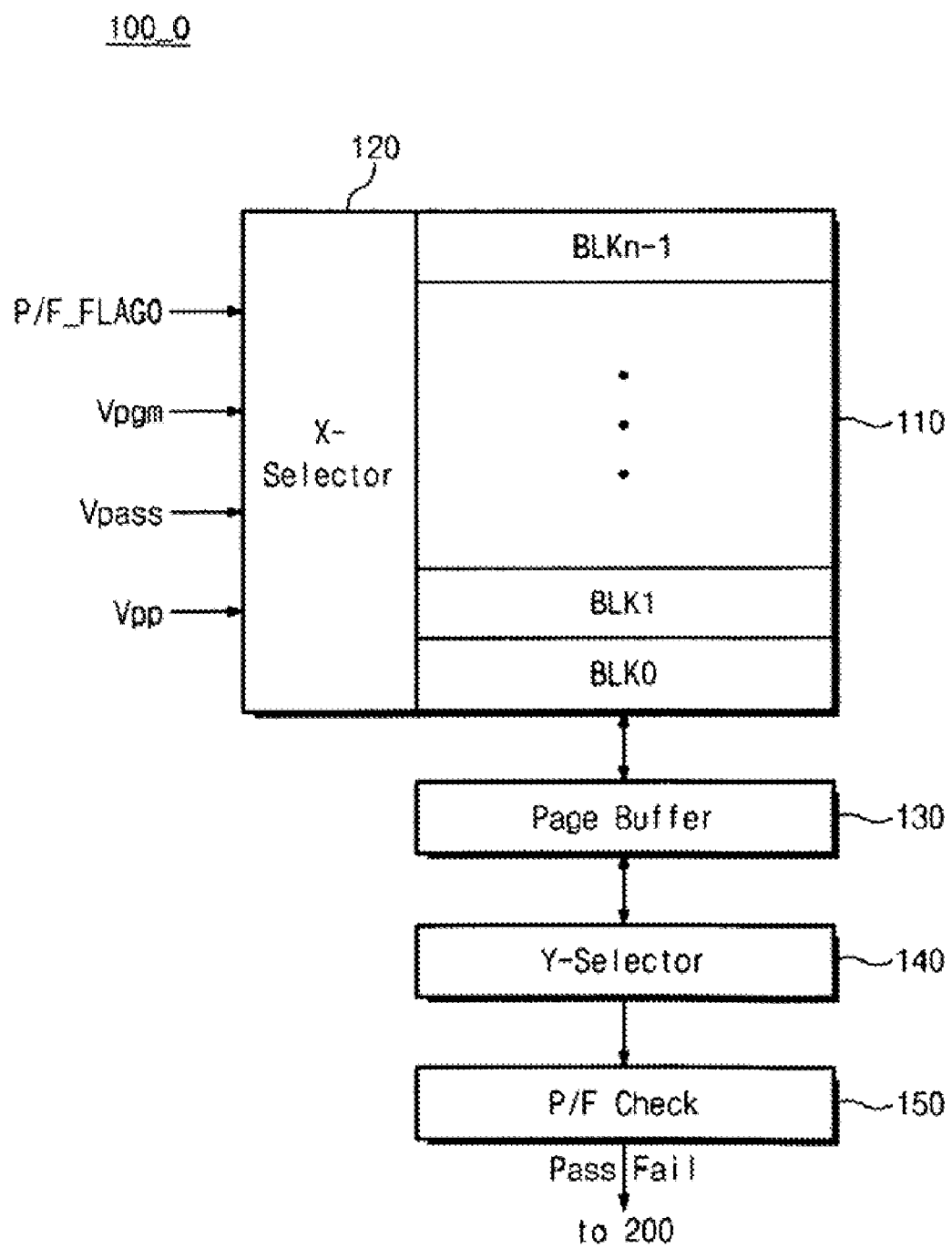
FIG. 3 is a block diagram showing a plane illustrated in FIG. 2.

FIG. 3 is a block diagram showing a plane illustrated in FIG. 2. Respective planes 100_0~100_j-1 may be configured to have the same structure as that illustrated in FIG. 3.

Referring to FIG. 3, the plane 100_0 according to an exemplary embodiment of the present invention may include a memory cell array 110 having a plurality of memory blocks BLK0~BLKn-1, a row selector circuit 120, a page buffer circuit 130, a column selector circuit 140, and a pass/fail check circuit 150. Each of the memory blocks BLK0~BLKn-1 may include a plurality of memory cells arranged in rows (or word lines) and columns (or bit lines). The memory cell array 110 may store data information.

The row selector circuit 120 can select a memory block in response to an externally input block address (not shown) and select a word line in the selected memory block in response to a row address (not shown). The row selector circuit 120 may receive a program voltage Vpgm, a pass voltage Vpass, and a high voltage Vpp from the voltage generator circuit 300 shown in FIG. 2 and a control signal P/F_FLAG0 from the control logic 200 of FIG. 2. At a program operation, the row selector circuit 120 may apply the program voltage Vpgm to a selected word line and the pass voltage Vpass to respective unselected word lines. More specifically, the row selector circuit 120 may be configured to prevent the voltages Vpgm, Vpass, and Vpp from being applied to corresponding signal lines based upon activation of the control signal P/F_FLAG0.

The page buffer circuit 130 may include page buffers that are electrically connected respectively to bit lines shared by all memory blocks. Each of the page buffers may operate as a sense amplifier or a write driver based on a mode of operation. For example, in a program operation, the page buffer circuit 130 may store data provided via the column selector circuit 140 and drive bit lines of the memory cell array 110 with a predetermined voltage, for example, a power-supply voltage, or a ground voltage, based on the stored data, respectively. In a read or verify operation, the page buffer circuit 130 may sense data bits stored in memory cells of a selected word line. In a read operation, the sensed data bits may be output externally via the column selector circuit 140. In a verify operation, the sensed data bits may be transferred to the pass/fail check circuit 150 via the column selector circuit 140.

The pass/fail check circuit 150 may check whether all data bits transferred via the column selector circuit 140 have a pass data value and provide a pass or fail signal to the control logic 200 of FIG. 2 as a verification result.

The control logic 200 may generate the control signal P/F_FLAG0 in response to the verification result from the pass/fail check circuit 150 to output the control signal P/F_FLAG0 to the row selector circuit 120.

During a multi-plane program operation, all or selected ones of the planes may perform a program operation separately. More specifically, during a verification interval, the pass/fail check circuit 150 of each plane may check whether the memory cells are normally programmed. If a plane, for example, 100_0, is judged to be program-passed, a program operation may be made as follows.

The pass/fail check circuit 150 of the program-passed plane provides a pass signal to the control logic 200 as a verification result. The control logic 200 activates the control signal P/F_FLAG0 in response to the pass signal from the pass/fail check circuit 150. The row selector circuit 120 of the program-passed plane interrupts the program and pass voltages Vpgm and Vpass or the high voltage Vpp supplied from the voltage generator circuit 300 in response to the activated control signal P/F_FLAG0. Accordingly, it is possible to prevent memory cells of a selected memory block in the program-passed plane 100_0 from being subjected to undue stress.

If a plane, for example, 100_0, is judged to be program-failed, a program operation may be performed as follows.

The pass/fail check circuit 150 of the program-failed plane may provide a fail signal to the control logic 120 as a verification result. The control logic 200 may inactivate the control signal P/F_FLAG0 in response to the fail signal from the pass/fail check circuit 150. The row selector circuit 120 may receive the voltages Vpgm, Vpass, and Vpp in response to the inactivated control signal P/F_FLAG0, so that a program operation is again performed with respect to the program-failed plane.

Figure 4:
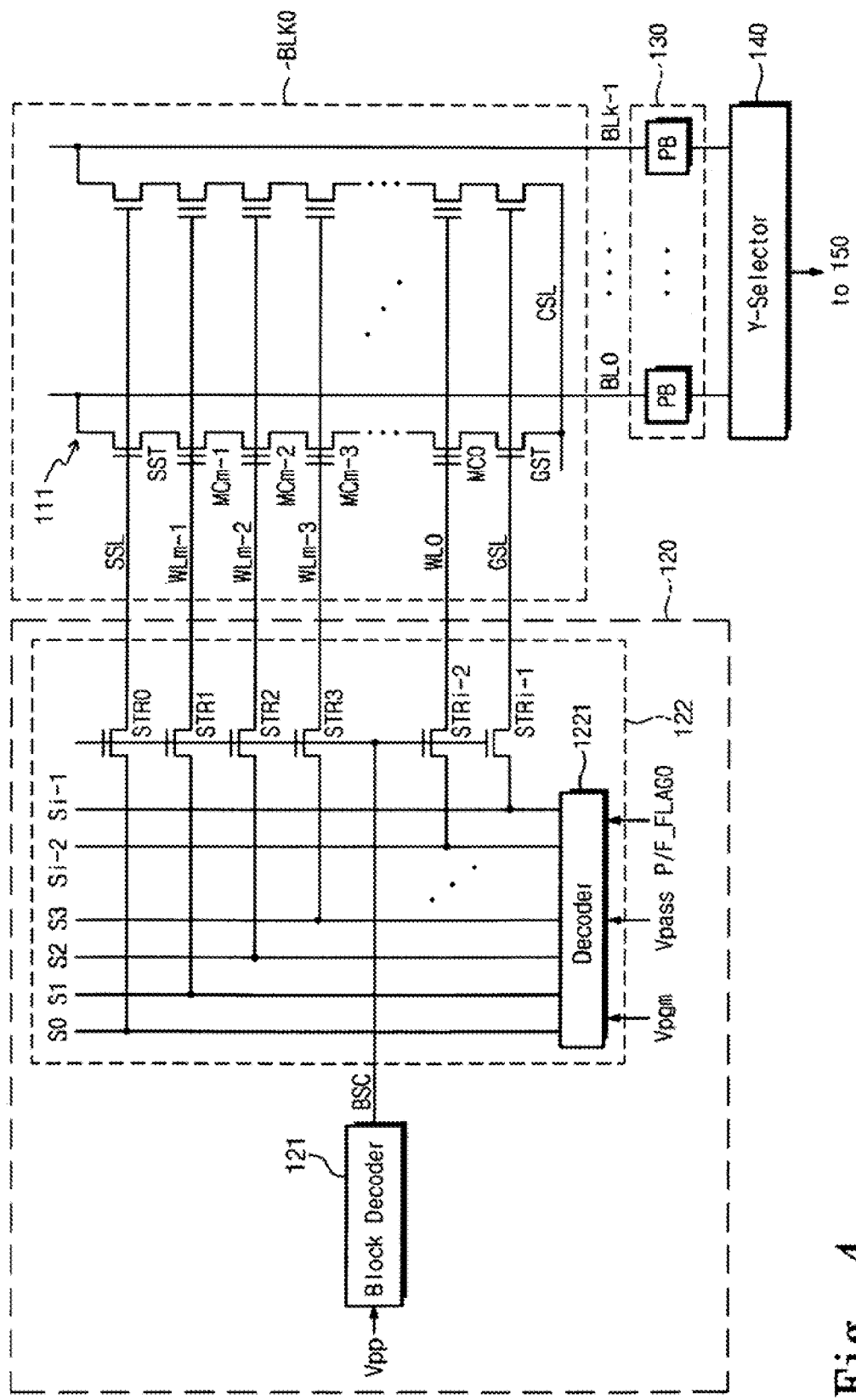
FIG. 4 is a block diagram showing a row selector circuit illustrated in FIG. 3 according to an exemplary embodiment of the present invention.

FIG. 4 is a block diagram showing a row selector circuit illustrated in FIG. 3 according to an exemplary embodiment of the present invention.

Referring to FIG. 4, a memory block BLK0 may include a plurality of transistor strings 111, each of which has a string select transistor SST, a ground select transistor GST, and a plurality of memory cell transistors MC0~MCm-1 connected in series between the select transistors SST and GST. The strings 111 are electrically connected to corresponding bit lines BL0~BLk−1, respectively. Although not illustrated in the figures, the bit lines BL0~BLk−1 may be arranged so as to be shared by all memory blocks BLK0~BLKn−1 of the plane 100_0. In each string 111, the string select transistor SST is connected to a string select line SSL, the ground select transistor GST is connected to a ground select line GSL, and the memory cell transistors MC0~MCm−1 are respectively connected to corresponding word lines WL0~WLm−1.

The row selector circuit 120 may include a block decoder 121 and a row decoder 122. The row decoder 122 may include select transistors STR0~STRi−1. The lines SSL, WL0~WLm−1, and GSL are respectively connected to corresponding select lines S0~Si−1 through the select transistors STR0~STRi−1.

The row decoder 122 may further comprise a decoder 1221 that is configured to transfer corresponding voltages, supplied from the voltage generator circuit shown in FIG. 2, to the select lines S0~Si−1 in response to row address information and the control signal P/F_FLAG0. The decoder 1221 operates as a word line driver circuit. The decoder 1221 interrupts the program and pass voltages Vpgm and Vpass supplied from the voltage generator circuit 300 shown in FIG. 2 in response to an activated control signal P/F_FLAG0. At this time, the decoder 1221 drives the select lines S1~Si−2 with either a predetermined voltage or a ground voltage and drives the select lines S0 and Si−1 with a power-supply voltage and a ground voltage, so that the word lines WL0~WLm−1 are driven with a ground voltage or the predetermined voltage. In this exemplary embodiment, the predetermined voltage may be a voltage identical to or lower than a power supply voltage.

Gates of the select transistors STR0~STRi−1 are commonly connected to a block select line BSC, which is output from the block decoder 121. The block decoder 121 may select a memory block in response to externally input block address information. That is, the block decoder 121 may activate or inactivate the block select line BSC in response to the block address information. The page buffer circuit 130 may include page buffers PB connected to the bit lines BL0~BLk−1, respectively. In a program verify operation, each of the page buffers PB may output read data to the pass/fail check circuit 150 via the column selector circuit 140. Data transferred to the pass/fail check circuit 150 may be used to check whether a program operation of selected memory cells is normally performed. Exemplary page buffer and pass/fail check circuits are disclosed in U.S. Pat. No. 5,299,162 entitled 'Nonvolatile Semiconductor Memory Device And An Optimizing Programming Method Thereof', the entire contents of which are hereby incorporated by reference.

Figure 5:
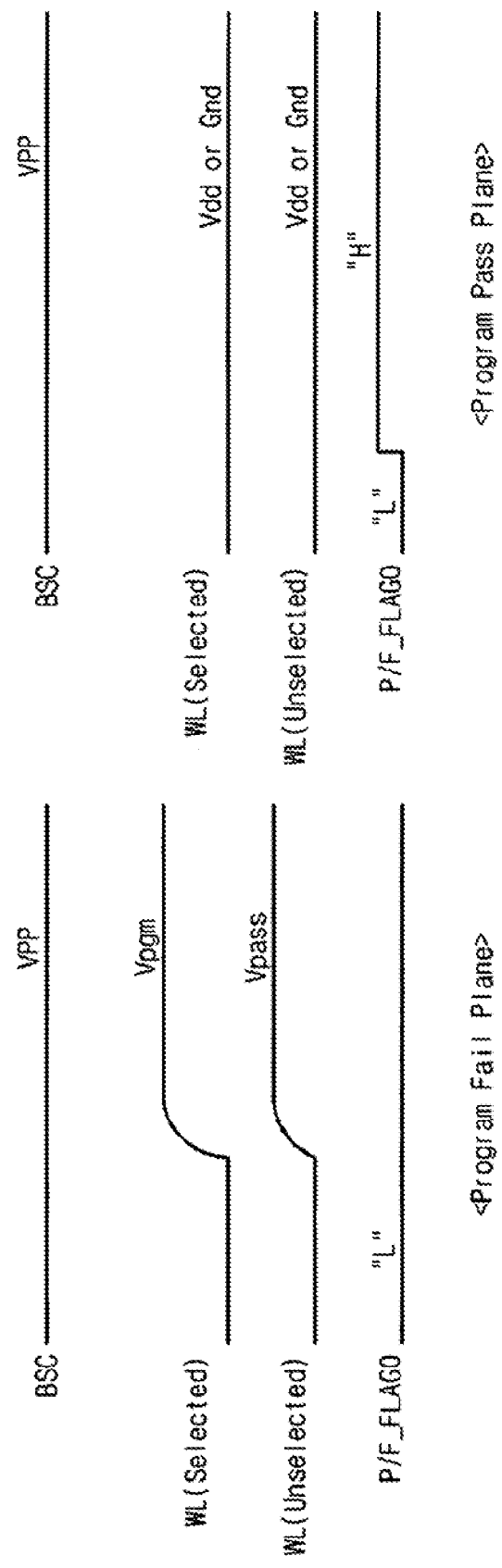
FIG. 5 is a timing diagram for describing a multi-plane program operation of a flash memory device including a row selector circuit illustrated in FIG. 4.

FIG. 5 is a timing diagram for describing a multi-plane program operation of a flash memory device including a row selector circuit illustrated in FIG. 4. Below, a multi-plane program operation of the flash memory device according to an exemplary embodiment of the present invention will be more fully described with reference to FIGS. 4 and 5. For convenience of description, a multi-plane program operation will be described using plane, 100_0, however, it will be seen by one of ordinary skill in the art that the present invention can be applied to other planes.

Figure 6:
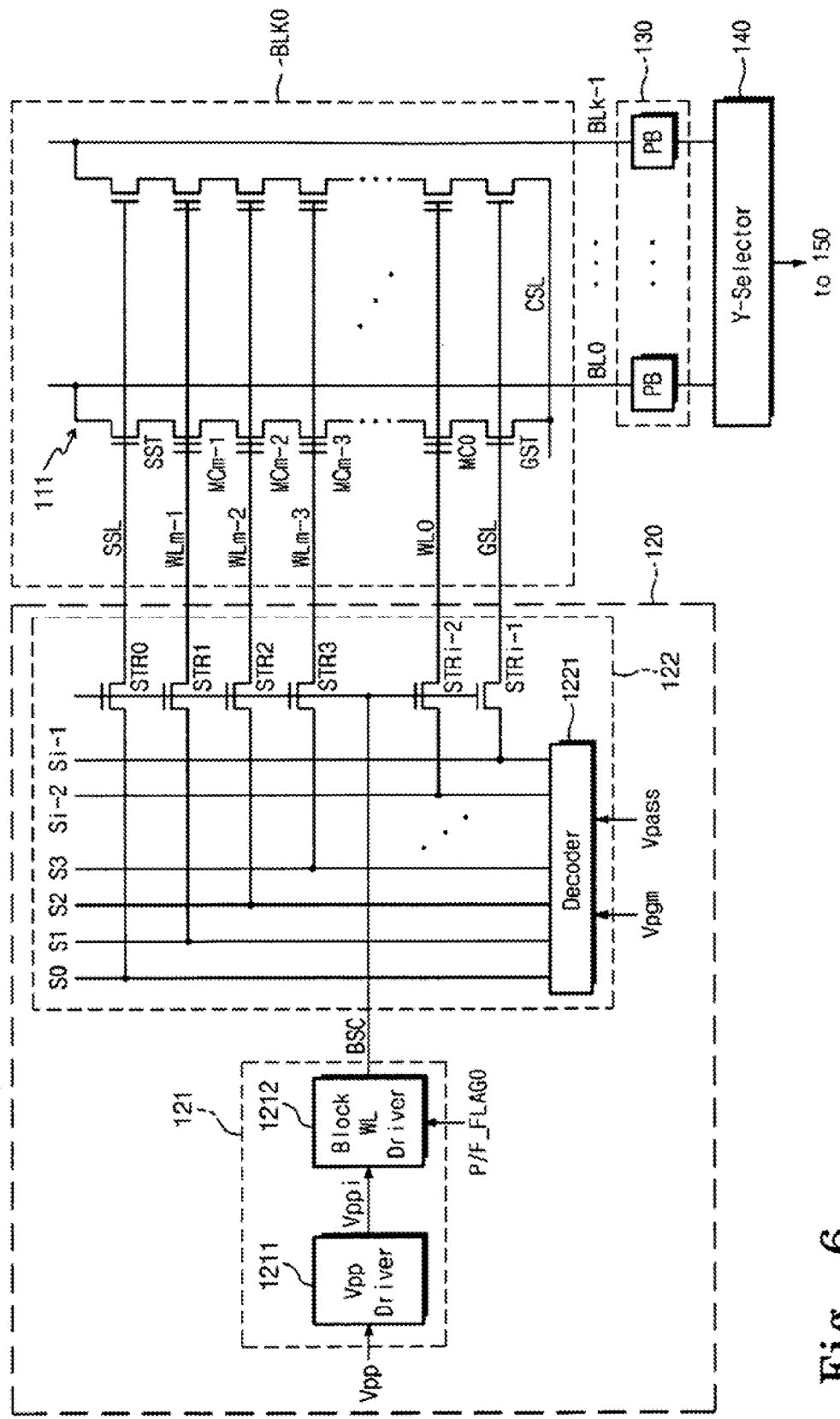
FIG. 6 is a block diagram showing a row selector circuit illustrated in FIG. 3 according to an exemplary embodiment of the present invention.

Once a multi-plane program operation commences, the block decoder 121 of FIG. 2 may drive a block select line BSC with a high voltage Vpp from a voltage generator circuit 300 shown in FIG. 2, so that select transistors STR0~STRi−1 shown in FIG. 4 are turned on. More specifically, the block decoder 121 may include a high-voltage driver 1211 and a block word line driver 1212, which are illustrated in FIG. 6.

The high-voltage driver 1211 may provide the high voltage Vpp from the voltage generator circuit 300 to the block word line driver 1212 as a block word line voltage Vppi. The block word line driver 1212 of the block decoder 121 may drive the block select line BSC with the block word line voltage Vppi being the high voltage Vpp.

In the case where the plane 100_0 is judged to be program-passed after a program verify operation, control logic 200 of FIG. 2 may activate a control signal P/F_FLAG0 to go high in response to a verification result of the pass/fail check circuit 150. The decoder 1221 in the row decoder 122 may prevent the program and pass voltages Vpgm and Vpass from being transferred to select lines S1~Si−2 in response to the activated control signal P/F_FLAG0. At the same time, the decoder 1221 may drive the select line S1~Si−2 with a predetermined voltage or a ground voltage Gnd. Accordingly, a ground voltage or a predetermined voltage may be applied to all word lines in a selected memory block via the turned-on select transistors STR1~STRi−2. In this exemplary embodiment, the predetermined voltage may be a power-supply voltage Vdd or a voltage lower than the power-supply voltage. Because programmed memory cells in the program-passed plane are supplied with the predetermined voltage or the ground voltage during a program operation, it is possible to prevent program stress (or disturbance) of the programmed memory cells due to a program operation for program-failed planes.

In the case that the plane 100_0 is judged to be program-failed, as illustrated in FIG. 5, the control logic 200 may inactivate the control signal P/F_FLAG0 to a low level in response to a verification result of the pass/fail check circuit 150. The decoder 1221 in the row decoder 122 shown in FIG. 4 may drive select lines corresponding to the word lines WL0~WLm−1 with corresponding program and pass voltages Vpgm and Vpass, respectively, in response to the inactivated control signal P/F_FLAG0. That is, a selected word line is driven with the program voltage Vpgm and unselected word lines are driven with the pass voltage Vpass. Accordingly, a program operation may be made with respect to the program-failed plane.

FIG. 6 is a block diagram showing a row selector circuit 120 illustrated in FIG. 3 according to an exemplary embodiment of the present invention. In FIG. 6, constituent elements that are substantially identical to those in FIG. 4 are marked by the same numerals, and a description thereof is thus omitted.

Referring to FIG. 6, the block decoder 121 may include the high-voltage driver 1211 and the block word line driver 1212. The high-voltage driver 1211 transfers a high voltage Vpp from the voltage generator circuit 300 shown in FIG. 2 to the block word line driver 1212 as the block word line voltage Vppi. The block word line driver 1212 may respond to a control signal P/F_FLAG0 from control logic 200 to determine whether to apply the block word line voltage Vppi to the block word line BSC.

Figure 7:
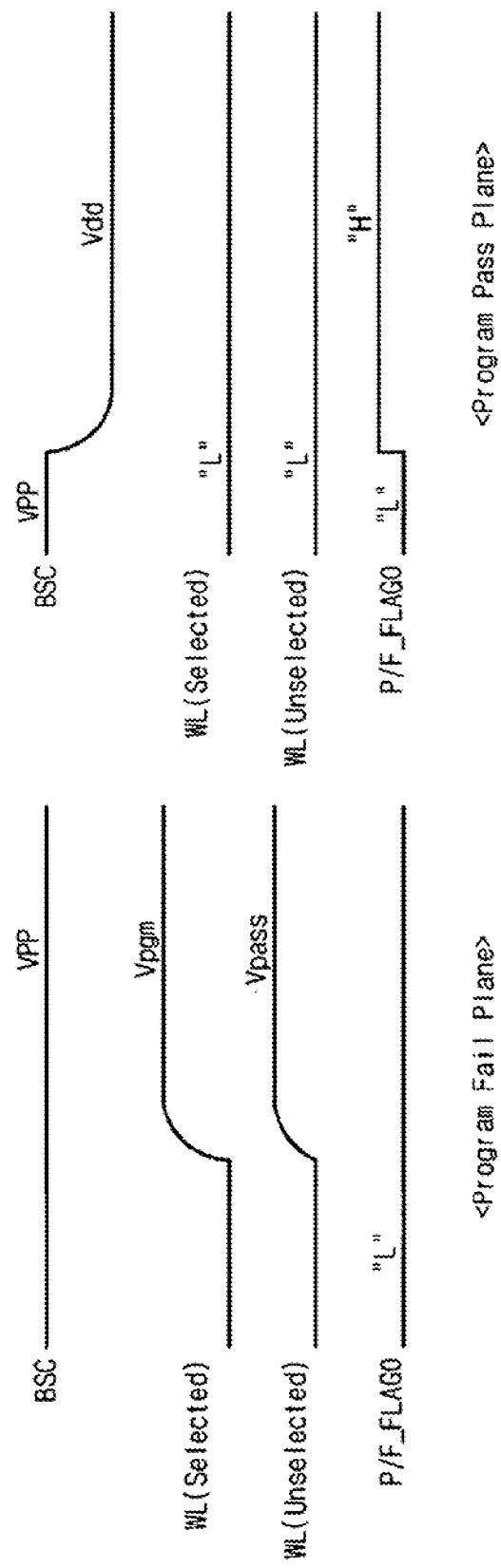
FIG. 7 is a timing diagram for describing a multi-plane program operation of a flash memory device including a row selector circuit illustrated in FIG. 6.

FIG. 7 is a timing diagram for describing a multi-plane program operation of a flash memory device including a row selector circuit 120 illustrated in FIG. 6. Hereinafter, a multi-plane program operation according to the flash memory device will be more fully described with reference to FIGS. 6 and 7.

Basically, a program operation may be performed identically to that described above. After the program operation, a verify operation may be made. A plane may be judged to be program-passed or program-failed as a verification result.

In the case that the plane is judged to be program-passed, as illustrated in FIG. 7, control logic 200 may activate a control signal P/F_FLAG0 in response to a verification result from the program-passed plane 100_0. The block word line driver 1212 may interrupt transferring the block word line voltage Vppi as the high voltage Vpp in response to the activated control signal P/F_FLAG0. At this time, the block word line driver 1212 may output a predetermined voltage, for example, identical or lower than a power-supply voltage, as the block word line voltage Vppi in response to the activated control signal P/F_FLAG0. This means that the block word line BSC is driven with the predetermined voltage via the block word line driver 1212. Alternatively, a ground voltage may be applied to the block word line BSC instead of the predetermined voltage. As a result, the select transistors STR0~STRi-1 may be slightly turned on by the block word line BSC that is driven with the predetermined voltage. This makes it possible to limit the predetermined voltage of the respective program and pass voltages Vpgm and Vpass to be applied to the word lines WL0~WLm-1.

As a result, it is possible to prevent the respective program and pass voltages Vpgm and Vpass from being applied to selected memory cells in the program-passed plane. That is, program disturbance may be reduced with respect to the program-passed plane.

In the case where the plane 100_0 is judged to be program-failed, as illustrated in FIG. 7, the control logic 200 may inactivate the control signal P/F_FLAG0 in response to a verification result from the program-failed plane. As the control signal P/F_FLAG0 is inactivated, that is, set to a low-level, the block word line BSC may be driven with the high voltage Vpp, that is, the block word line voltage Vppi. This enables the select transistors STR0~STRi-1 to be turned on so as to transfer the respective program and pass voltages Vpgm and Vpass to corresponding word lines of the program-failed plane. This means that a program operation is again made with respect to the program-failed plane.

As will be understood from the above description, the flash memory device 1000 according to an exemplary embodiment of the present invention may be configured to prevent the respective program and pass voltages Vpgm and Vpass from being applied to memory cells of a program-passed plane, with at least one plane being program-failed. Thus, the flash memory device 1000 is capable of reducing program disturbance.

Figure 8:
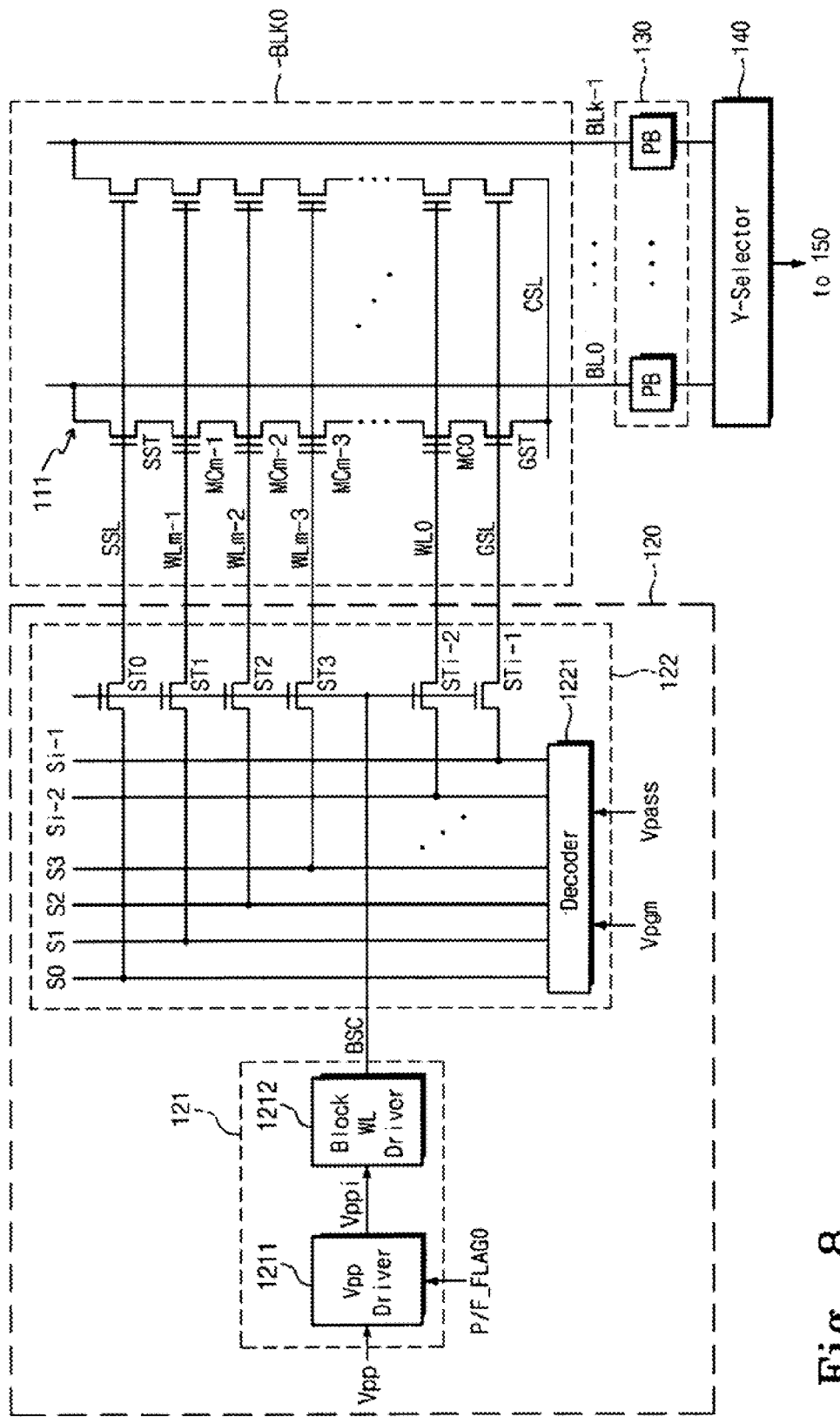
FIG. 8 is a block diagram showing a row selector circuit illustrated in FIG. 3 according to an exemplary embodiment of the present invention.

FIG. 8 is a block diagram showing a row selector circuit 120 illustrated in FIG. 3 according to an exemplary embodiment of the present invention.

The row selector circuit 120 illustrated in FIG. 8 is substantially identical to that in FIG. 6 except that the control signal P/F_FLAG0 is applied to the high-voltage driver 1211 instead of to the block word line driver 1212. For convenience of description, constituent elements that are identical to those in FIG. 6 are marked by the same numerals, and description thereof is thus omitted. The high-voltage driver 1211 may respond to the control signal P/F_FLAG0 from control logic 200 to determine an output of a high voltage Vppi.

Figure 9:
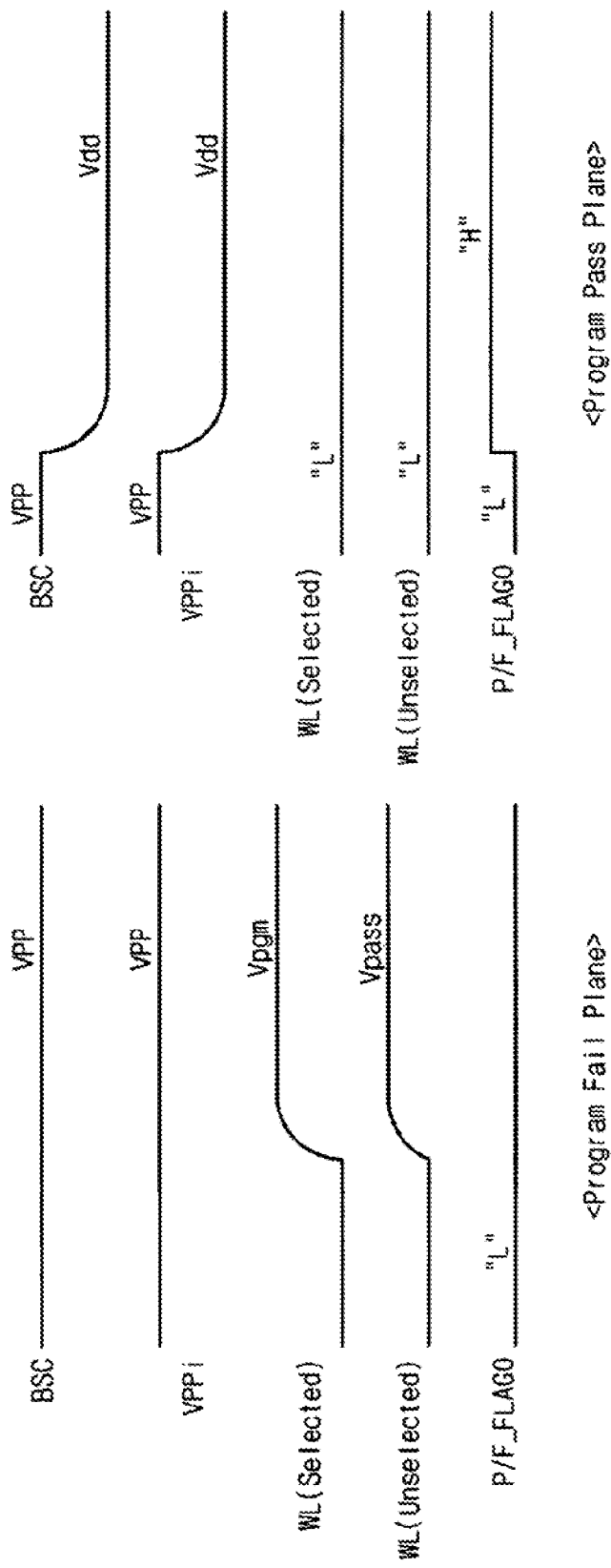
FIG. 9 is a timing diagram for describing a multi-plane program operation of a flash memory device including a row selector circuit illustrated in FIG. 8.

FIG. 9 is a timing diagram for describing a multi-plane program operation of a flash memory device including a row selector circuit illustrated in FIG. 8. Hereinafter, a multi-plane program operation according to the flash memory device will be more fully described with reference to FIGS. 8 and 9.

Basically, a program operation may be performed identically to that described above. After the program operation, a verify operation may be performed. A plane may be judged to be program-passed or program-failed as a verification result. In the case that the plane is judged to be program-passed, as illustrated in FIG. 9, the control logic 200 shown in FIG. 2 may activate a control signal P/F_FLAG0 in response to a verification result from the program-passed plane 100_0. The activated control signal P/F_FLAG0 may be applied to a high-voltage driver 1211.

The high-voltage driver 1211 may interrupt the high voltage Vpp from the voltage generator circuit 300 shown in FIG. 2 in response to the activated control signal P/F_FLAG0. At this time, the high-voltage driver 1211 may output a predetermined voltage, for example, a voltage identical to or lower than a power supply voltage, as a block word line voltage Vppi. As illustrated in FIG. 9, the predetermined voltage may be applied to a block word line BSC via a block word line driver 1212. Afterwards, an operation will be performed in the same manner as described above. That is, a program operation may be prevented with respect to the program-passed plane.

If a plane is judged to be program-failed, as illustrated in FIG. 9, the control logic 200 may inactivate the control signal P/F_FLAG0 by setting it to a low level in response to a verification result from the program-failed plane. The control logic 200 may apply the inactivated control signal P/F_FLAG0 to the high-voltage driver 1211. As the control signal P/F_FLAG0 is inactivated, the high-voltage driver 1211 may output the high voltage Vpp as the block word line voltage Vppi to the block word line driver 1212. This means that the block word line BSC is driven with the high voltage Vpp being the block word line voltage Vppi. Afterwards, an operation will be performed in the same manner as described above.

As a result, it is possible to prevent the respective program and pass voltages Vpgm and Vpass from being applied to selected memory cells in the program-passed plane. That is, program disturbance may be reduced with respect to the program-passed plane.

Figure 10:
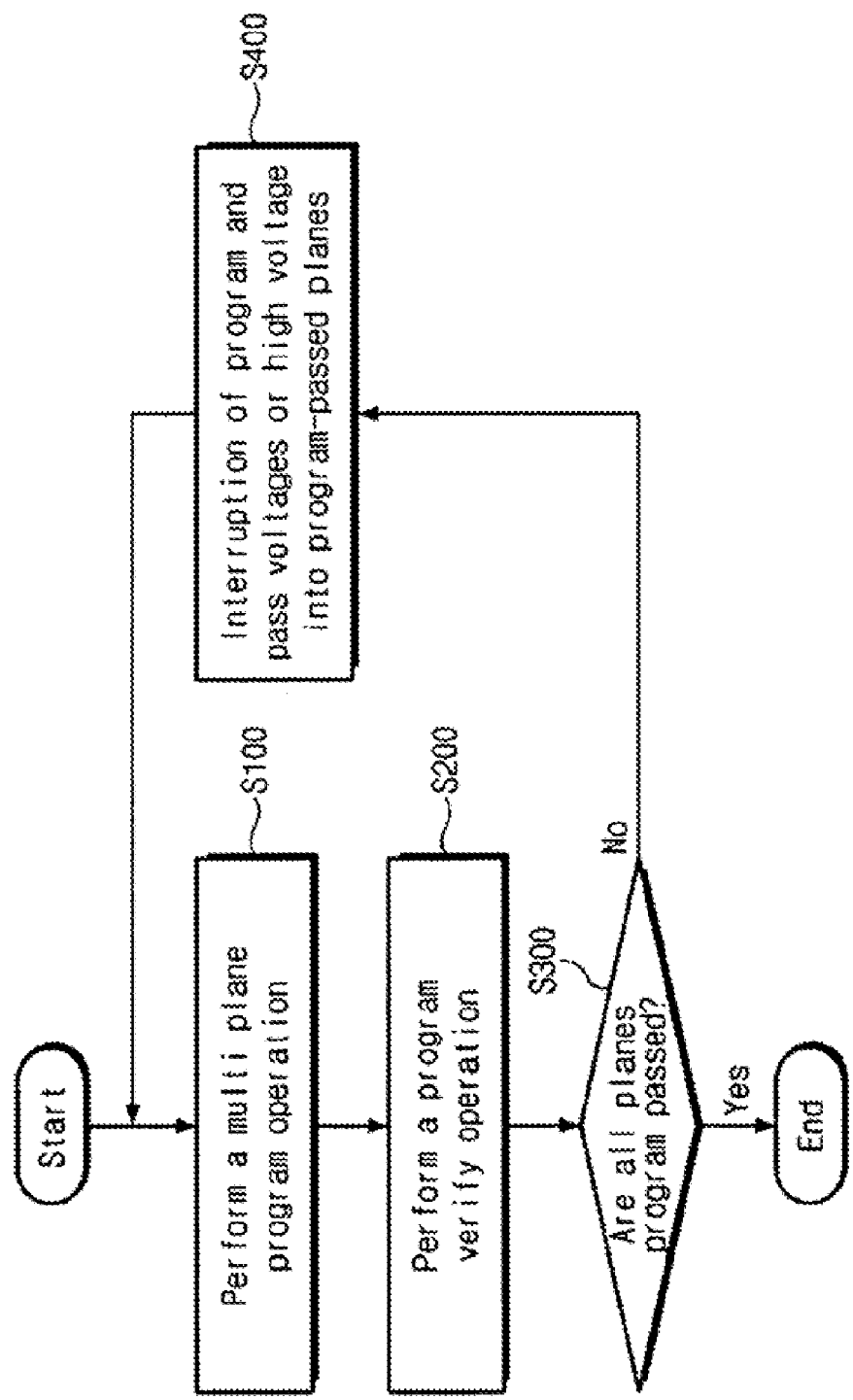
FIG. 10 is a flow diagram for describing a multi-plane program operation of a flash memory device according to an exemplary embodiment of the present invention.

FIG. 10 is a flow diagram for describing a multi-plane program operation of a flash memory device according to an exemplary embodiment of the present invention.

Referring to FIG. 10, a multi-plane program method of a flash memory device according to an exemplary embodiment of the present invention may include performing a multi-plane program operation (S100); performing a program verify operation with respect to all or selected planes (S200); checking whether all or selected planes are program-passed (S300); if at least one plane is judged to be program-failed, repeating the steps S100 to S300 with the program and pass voltages/the high voltage being interrupted with respect to program-passed planes (S400).

As described above, when one or more planes of the multi-planes are program-passed before other planes of the multi-planes are program-passed, during the multi-plane operation, the flash memory device 1000 according to exemplary embodiments of the present invention interrupts supplying the program voltage to the program-passed plane(s). For example, when one or more planes of the multi-planes are program-passed before other planes of the multi-planes are program-passed, the flash memory device 1000 according to exemplary embodiments of the present invention interrupts supplying the pass voltage to the program-passed plane(s). Alternatively, in this case, the flash memory device 1000 according to exemplary embodiments of the present invention interrupts supplying the high voltage to the program-passed plane(s). According to exemplary embodiments of the present invention, a program disturbance is reduced. Thus, reliability of the flash memory device 1000 is advanced.

It will be understood that the flash memory device 1000 described above may be configured to store at least one bit per memory cell.

In the above-described exemplary embodiments, the technical spirit of the present invention is described referring to the flash memory device 1000. The technical spirit of the present invention, however, is not limited to the flash memory device 1000. For example, it will be understood that the technical spirit of the present invention may be applied to a nonvolatile memory device, such as a read only memory (ROM), a programmable ROM (PROM), an electrically programmable ROM (EPROM), an electrically erasable PROM (EEPROM), a flash memory, a phase change random access memory (PRAM), a magnetic RAM (MRAM), a resistive RAM (RRAM), a ferroelectric RAM (FRAM), and the like.

Figure 11:
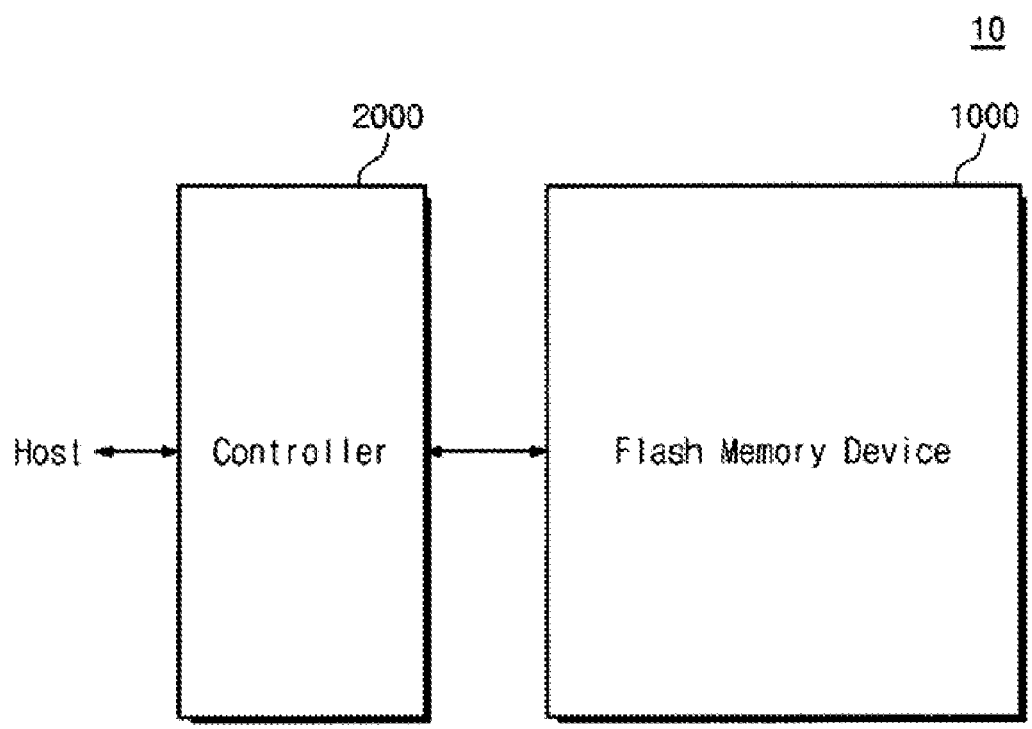
FIG. 11 illustrates a block diagram of a memory system including the flash memory device shown in FIG. 2.

FIG. 11 is a block diagram of a memory system 10 including the flash memory device 1000 shown in FIG. 2. Referring to FIG. 11, the memory system 10 according to an exemplary embodiment of the present invention includes the flash memory device 1000 and a controller 2000.

The flash memory device 1000 may be configured to operate in the same manner as described referring to FIGS. 1 to 10. For example, when a program operation of a first storage area is passed before a program operation of a second storage area is passed, the program operation of the first storage area is completed and the program operation of the second storage area is continued.

The controller 2000 is connected with a host (not shown) and the flash memory device 1000.

The controller 2000 is configured to access the flash memory device 1000 in response to a request from the host. For example, the controller 2000 is configured to control read, program and erase operations of the flash memory device 1000. In another example, the controller 2000 is configured to provide an interface between the flash memory device 1000 and the host. In yet another example, the controller 2000 is configured to drive firmware for controlling the flash memory device 1000.

The controller 2000 may include elements (not shown) that are well known to one having ordinary skill in the related art, such as a RAM, a processing unit, a host interface, a memory interface, and the like. The RAM may be used as a work memory of the processing unit. The processing unit may control various operations of the controller 2000.

The host interface may include a protocol for exchanging data between the host and the controller 2000. In an exemplary embodiment, the controller 2000 may be configured to communicate with an exterior, that is the host, using one of various protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA (SATA) protocol, a parallel ATA (PATA) protocol, a small computer small interface (SCSI) protocol, an enhanced small disk interface (ESDI) protocol, an integrated drive electronics (IDE) protocol, an enhanced IDE (EIDE) protocol, and the like. The memory interface may be configured to interface with the flash memory device 1000.

The memory system 10 may further include an error correcting block (not shown). The error correcting block may be configured to detect errors of data read from the flash memory device 1000 and correct the detected errors. In an example, the error correcting block may be provided as an element of the controller 2000. In another example, the error correcting block may be provided as an element of the flash memory device 1000.

The flash memory device 1000 and the controller 2000 may be integrated into a single semiconductor device. In an example, the flash memory device 1000 and the controller 2000 may be integrated into a semiconductor device to form a memory card (not shown). For example, the flash memory device 1000 and the controller 2000 may be integrated into a semiconductor device to form a memory card, such as a personal computer memory card international association card (PCMCIA card or PC card), a compact flash card (CF card), a smart media card (SM or SMC), a memory stick, a multimedia card (MMC), a reduced size MMC (RS-MMC), a MMC micro, a secure digital card (SD card), a mini SD card, a micro SD card, a SD high capacity (SDHC) card, an universal flash storage card (UFS card), and the like.

In another example, the flash memory device 1000 and the controller 2000 may be integrated into a semiconductor memory device to form a single semiconductor device, such as a solid state drive (SSD). For example, the SSD includes a storage device configured to store data into a semiconductor memory. When the memory system 10 is used as the SSD, the operation speed of the host connected with the memory system may be extremely advanced.

In another example, the memory system 10 may be applied as one of various elements of an electronic device, such as a computer, a mobile computer, an ultra mobile PC (UMPC), a workstation, a net-book, a personal digital assistants (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device that is able to transmit and receive information in a wireless circumstance, one of various devices composing a home network, one of various devices composing a computer network, one of various devices composing a telematics network, a radio frequency identifier (RFID) or one of various devices, that is, a SSD, a memory card, and the like, composing a computing system In another example, the flash memory 1000 or the memory system 10 may be packaged as one of various types to be subsequently embedded. For example, the flash memory device 1000 or the memory system 10 may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 12:
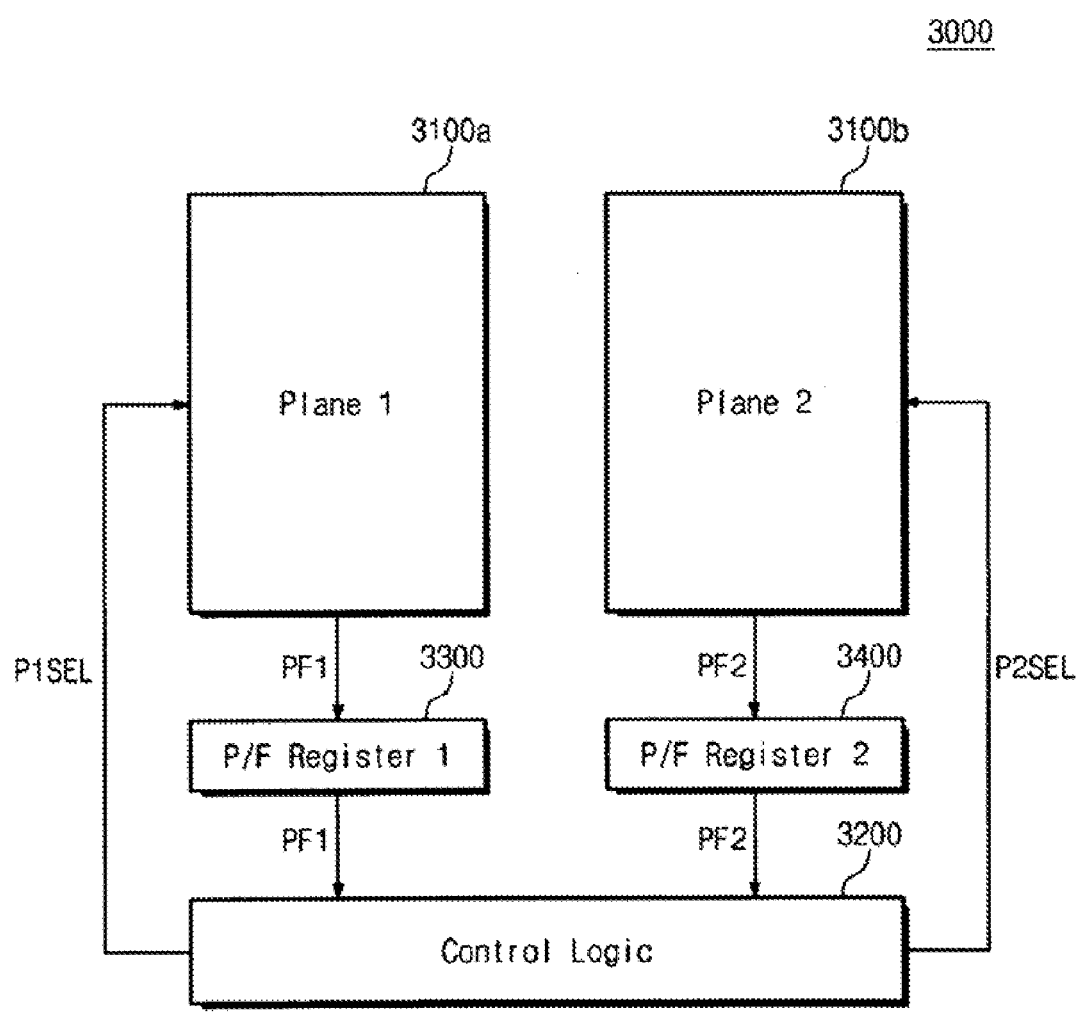
FIG. 12 is a block diagram illustrating a flash memory device which is another embodiment of the flash memory device in FIG. 11.

FIG. 12 is a block diagram illustrating a flash memory device 3000 that is an exemplary embodiment of the flash memory device 1000 in FIG. 11. Referring to FIG. 12, the flash memory device 3000 includes a first plane 3100a, a second plane 3100b, a first pass/fail register 3300, a second pass/fail register 3400 and a control logic 3200.

The first and second planes 3100a and 3100b include memory cells configured to store data, respectively. The first and second planes 3100a and 3100b may be configured to store at least a bit per memory cell. The first and second planes 3100a and 3100b may be configured to execute program and read operations independently. The first and second planes 3100a and 3100b may be configured identically to each other. The first and second planes 3100a and 3100b are described more particularly referring to FIG. 12 to FIG. 15

Referring to FIG. 12, first plane 3100a is configured to receive a first selection signal P1SEL from the control logic 3200. The first plane 3100a may be activated in response to the first selection signal P1SEL. For example, the first plane 3100a may be configured to execute a read/program operation when the first selection signal P1SEL is activated.

The first plane 3100a is configured to output a first pass/fail signal PF1. The first pass/fail signal PF1 indicates whether the first plane 3100a is program-passed during a program operation of the first plane 3100a. For example, when the first plane 3100a is program-passed, the first pass/fail signal PF1 may be activated.

The second plane 3100b is configured to receive a second selection signal P2SEL from the control logic 3200. The second plane 3100b may be activated in response to the second selection signal P2SEL. For example, the second plane 3100b may be configured to execute a read/program operation when the second selection signal P2SEL is activated.

The second plane 3100b is configured to output a second pass/fail signal PF2. The second pass/fail signal PF2 indicates whether the second plane 3100b is program-passed during a program operation of the second plane 3100b. For example, when the second plane 3100b is program-passed, the second pass/fail signal PF2 may be activated.

The first pass/fail register 3300 is configured to receive the first pass/fail signal PF1 from the first plane 3100a. The first pass/fail register 3300 is configured to store the first pass/fail signal PF1. The first pass/fail signal PF1 stored in the first pass/fail register 3300 may be transferred to the control logic 3200.

The second pass/fail register 3400 is configured to receive the second pass/fail signal PF2 from the second plane 3100b. The second pass/fail register 3400 is configured to store the second pass/fail signal PF2. The second pass/fail signal PF2 stored in the second pass/fail register 3400 may be transferred to the control logic 3200.

The control logic 3200 is configured to control various operations of the flash memory device 3000. The control logic 3200 is configured to receive the first pass/fail signal PF1 from the first pass/fail register 3300. The control logic 3200 is configured to output the first selection signal P1SEL. In an example, the control logic 3200 is configured to activate the first selection signal P1SEL when a read or program operation of the first plane 3100a is executed. For example, the control logic 3200 may activate the first selection signal P1SEL using a plane address. That is, when the first plane 3100a is selected by the plane address, the first selection signal P1SEL may be activated. In an example, the control logic 3200 is configured to deactivate the first selection signal P1SEL when the first pass/fail signal PF1 is activated. For example, when the first pass/fail signal PF1 is activated, the control logic 3200 may deactivate the first selection signal PF1 regardless of other conditions, that is, regardless of the plane address. That is, when the first plane 3100a is program-passed, the first plane 3100a may be deactivated.

The control logic 3200 is configured to receive the second pass/fail signal PF2 from the second pass/fail register 3400. The control logic 3200 is configured to output the second selection signal P2SEL. In an example, the control logic 3200 is configured to activate the second selection signal P2SEL when a read or program operation of the second plane 3100b is executed. For example, the control logic 3200 may activate the second selection signal P2SEL using the plane address. That is, when the second plane 3100b is selected by the plane address, the second selection signal P2SEL may be activated. In an example, the control logic 3200 is configured to deactivate the second selection signal P2SEL when the second pass/fail signal PF2 is activated. For example, when the second pass/fail signal PF2 is activated, the control logic 3200 may deactivate the second selection signal PF2 regardless of other conditions, that is, regardless of the plane address. That is, when the second plane 3100b is program-passed, the second plane 3100b may be deactivated.

Figure 13:
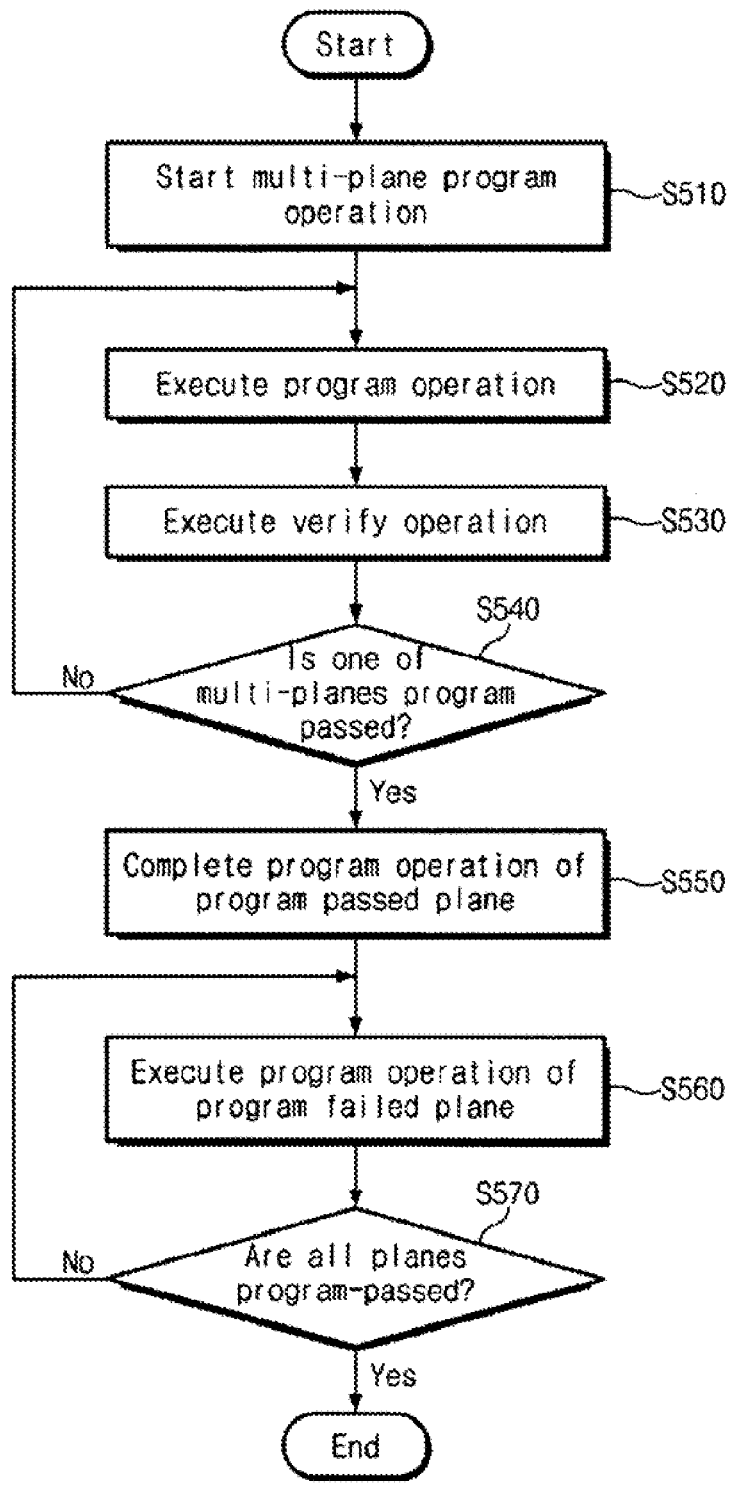
FIG. 13 is a flow chart for describing a program operation of the flash memory device in FIG. 12.

FIG. 13 is a flow chart showing a program operation of the flash memory device 3000 shown in FIG. 12. Referring to FIGS. 12 and 13, in a step S510, a multi-plane program operation is started. For example, addresses and data may be received from the controller 2000 shown in FIG. 11. The received addresses may include addresses of the first plane 3100a and addresses of the second plane 3100b, because the multi-plane program operation has started. The received data may also include data to be programmed into the first plane 3100a and data to be programmed into the second plane 3100b.

The control logic 3200 may activate the first selection signal P1SEL based on the received addresses of the first plane 3100a. The control logic 3200 may activate the second selection signal P2SEL based on the received addresses of the second plane 3100b.

In a step S520, a program operation is executed. The program operation of the first plane 3100a and the program operation of the second plane 3100b may be executed at the same time, because the first and second selection signals P1SEL and P2SEL are activated.

For example, bit lines of the first plane 3100a may be set up based on the received data of the first plane 3100a. At least one word line of the first plane 3100a may be selected based on the received addresses of the first plane 3100a. A program voltage may be applied to the selected word line of the first plane 3100a, and a pass voltage may be applied to unselected word lines of the first plane 3100a. Likewise, bit lines of the second plane 3100b may be set up based on the received data of the second plane 3100b. At least one word line of the second plane 3100b may be selected based on the received addresses of the second plane 3100b. A program voltage may be applied to the selected word line of the second plane 3100b, and a pass voltage may be applied to unselected word lines of the second plane 3100b. The program operations of the first and second planes 3100a and 3100b may be executed simultaneously, because the multi-plane program operation is started.

In a step S530, a verify operation is executed. For example, the bit lines of the first plane 3100a may be set up by a predetermined positive voltage, that is, a power supply voltage. A verify voltage may be applied to the word lines of the first plane 3100a. Whether the first plane 3100a is program-passed or program-failed is determined according to changes of voltages of the bit lines of the first plane 3100a. The bit lines of the second plane 3100b may be set up by a predetermined positive voltage, that is, a power supply voltage. A verify voltage may be applied to the word lines of the second plane 3100b. Whether the second plane 3100b is program-passed or program-failed is determined according to changes of voltages of the bit lines of the second plane 3100b. In an example, the verify operation of the first plane 3100a and the verify operation of the second plane 3100b may be executed simultaneously, because the multi-plane program operation is started.

In a step S540, it is determined whether one of the multi-planes, that is, the first and the second planes 3100a and 3100b, is program-passed. When there is no program-passed plane, the program operations of the first and the second planes 3100a and 3100b may be executed once again in the step S520. The steps S520 to S540 may be repeated until one of the first and second planes 3100a and 3100b is program-passed.

When one of the first and second planes 3100a and 3100b is program-passed, a step S550 is executed. As an example, it is assumed that the first plane 3100a is program-passed and, further, it is assumed that the first plane 3100a is program-passed before the second plane 3100b is program-passed. That is, it is assumed that the first plane 3100a is program-passed and the second plane 3100b is program-failed. At this time, the first plane 3100a may activate the first pass/fail signal PF1. The activated first pass/fail signal PF1 may be stored into the first pass/fail register 3300.

In the step S550, the program operation of the program-passed plane is completed. The program operation of the first plane 3100a may be completed, because it is assumed that the first plane 3100a is program-passed. That is, the program operation of the first plane 3100a may not be executed any more.

For example, the control logic 3200 may operate in response to the first pass/fail signal PF1 stored in the first pass/fail register 3300. The control logic 3200 may deactivate the first selection signal P1SEL in response to the activation of the first pass/fail signal PF1. When the first pass/fail signal PF1 is activated, the control logic 3200 may deactivate the first selection signal P1SEL regardless of other conditions, that is, the plane addresses. Thus, the first plane 3100a may be deactivated. When the first plane 3100a is deactivated, the program operation of the first plane 3100a may not be executed.

The first pass/fail signal PF1 is being stored in the first pass/fail register 3300. When the first plane 3100a is program-passed, the activated first pass/fail signal PF1 is being stored in the first pass/fail register 3300. The control logic 3200 subsequently deactivates the first selection signal P1SEL in response to the activated first pass/fail signal PF1 stored in the first pass/fail register 3300. Thus, the program operation of the first plane 3100a will not be executed any more. That is, the program operation of the first plane is completed.

In a step S560, the program operation of the program-failed plane is executed. The program operation of the second plane 3100b may be executed because it is assumed that the second plane 3100b is program-failed. For example, the bit lines of the second plane 3100b may be set up and may be set up based on the verification result of the step S530. As described above, the program voltage may be applied to the selected word line of the second plane 3100b, and the pass voltage may be applied to the unselected word lines of the second plane 3100b. That is, the program operation of the second plane 3100b may be continued, even though the program operation of the first plane 3100a is completed.

In a step S570, it is determined whether all planes are program-passed. For example, it is determined whether both the first and the second planes 3100a and 3100b are program-passed. It is assumed that the first plane 3100a is program-passed in the step S540. Thus, if the second plane 3100b is program-passed, the multi-plane program operation may be completed. If the second plane 3100b is program-failed, the program operation of the second plane 3100b may be executed once again in the step S560. The steps S560 and S570 may be repeated until the second plane 3100b is found to be program-passed. That is, the program operation of the second plane 3100b may be executed repeatedly until the second plane 3100b is found to be program-passed. That is, the program operation of the second plane 3100b may be continuously repeated.

When the second plane 3100b is program-passed, the second plane 3100b will activate the second pass/fail signal PF2. The activated second pass/fail signal PF2 is stored into the second pass/fail register 3400. When the first and second pass/fail signals PF1 and PF2 are activated, the control logic 3200 can complete the multi-plane program operation.

As described above, the flash memory device 3000 according to an exemplary embodiment of the present invention executes the multi-plane program operation of the first and second planes 3100a and 3100b. When the first plane 3100a is program-passed prior to the second plane 3100b, the first plane 3100a is deactivated. The program operation of the second plane 3100b is repeated until the second plane 3100b is program-passed. That is, the first plane 3100a is deactivated while the second plane 3100b is programmed. Thus, disturbances due to a program voltage and a pass voltage are prevented in the program-passed first plane 3100a, while the program operation is executed in the second plane 3100b. Thus, reliabilities of the flash memory device 3000 are advanced.

In the exemplary embodiments described above, it is assumed that the first plane 3100a is program-passed before the second plane 3100b is program-passed. It will be understood, however, that the first and second planes 3100a and 3100b can be program-passed simultaneously. In this case, the program operations of the first and second planes 3100a and 3100b may be completed simultaneously.

Figure 14:
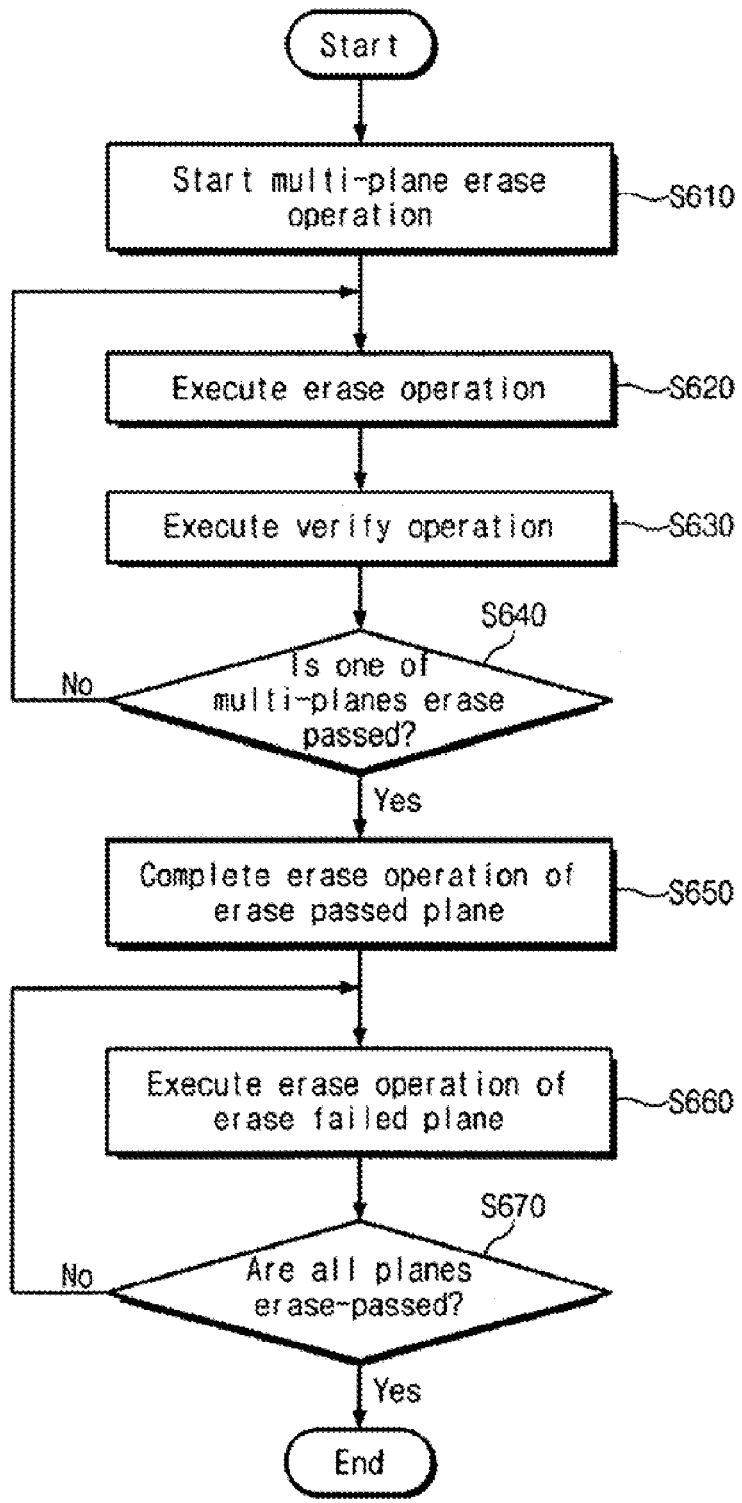
FIG. 14 is a flow chart for describing an erase operation of the flash memory device in FIG. 12.

FIG. 14 is a flow chart showing an erase operation of the flash memory device 3000 shown in FIG. 12. Referring to FIGS. 12 and 14, in a step S610, a multi-plane erase operation is started. As an example, addresses may be received from the controller 2000 shown in FIG. 11. The received addresses may include addresses of the first plane 3100a and addresses of the second plane 3100b, because the multi-plane erase operation is started. The control logic 3200 can activate the first selection signal P1SEL based on the received addresses of the first plane 3100a. The control logic 3200 can activate the second selection signal P2SEL based on the received addresses of the second plane 3100b.

In a step S620, an erase operation is executed. The erase operation of the first plane 3100a and the erase operation of the second plane 3100b may be executed at the same time, because the first and second selection signals P1SEL and P2SEL are activated.

As an example, bit lines of the first plane 3100a may be floated. An erase voltage, that is, a ground voltage, may be applied to word lines of the first plane 3100a. A bulk voltage, that is, a high voltage, may be supplied to a bulk area of the first plane 3100a. Bit lines of the second plane 3100b may be floated. An erase voltage, that is, a ground voltage, may be applied to word lines of the second plane 3100b. A bulk voltage, that is, a high voltage, may be supplied to a bulk area of the second plane 3100b. The erase operations of the first and second planes 3100a and 3100b may be executed simultaneously, because the multi-plane erase operation is started.

In a step S630, a verify operation is executed. For example, the bit lines of the first plane 3100a may be set up by a predetermined voltage, that is, a power supply voltage. A verify voltage, that is, a ground voltage, may be applied to the word lines of the first plane 3100a. Whether the first plane 3100a is erase-passed or erase-failed is determined according to changes of voltages of the bit lines of the first plane 3100a. The bit lines of the second plane 3100b may be set up by a predetermined voltage, that is, a power supply voltage. A verify voltage, that is, a ground voltage, may be applied to the word lines of the second plane 3100b. Whether the second plane 3100b is erase-passed or erase-failed is determined according to changes of voltages of the bit lines of the second plane 3100b. In an example, the verify operation of the first plane 3100a and the verify operation of the second plane 3100b may be executed simultaneously, because the multi-plane erase operation is started.

In a step S640, it is determined whether one of the multi-planes, that is, the first and the second planes 3100a and 3100b, is erase-passed. When there is no erase-passed plane, the erase operations of the first and the second planes 3100a and 3100b may be executed in the step S620. The steps S620 to S640 may be repeated until one of the first and second planes 3100a and 3100b is erase-passed.

When one of the first and second planes 3100a and 3100b is erase-passed, a step S650 is executed. As an example, it is assumed that the first plane 3100a is erase-passed and it is assumed that the first plane 3100a is erase-passed before the second plane 3100b is erase-passed. That is, it is assumed that the first plane 3100a is erase-passed and the second plane 3100b is erase-failed. At this time, the first plane 3100a may activate the first pass/fail signal PF1. The activated first pass/fail signal PF1 may be stored into the first pass/fail register 3300.

In the step S650, the erase operation of the erase-passed plane is completed. The erase operation of the first plane 3100a may be completed because it is assumed that the first plane 3100a is erase-passed. That is, the erase operation of the first plane 3100a will not be executed any more.

As an example, the control logic 3200 can operate in response to the first pass/fail signal PF1 stored in the first pass/fail register 3300. The control logic 3200 can deactivate the first selection signal P1SEL in response to the activation of the first pass/fail signal PF1. When the first pass/fail signal PF1 is activated, the control logic 3200 can deactivate the first selection signal P1SEL regardless of other conditions, that is, the plane addresses. Thus, the first plane 3100a may be deactivated. When the first plane 3100a is deactivated, the erase operation of the first plane 3100a will not be executed.

The first pass/fail signal PF1 is stored in the first pass/fail register 3300. When the first plane 3100a is erase-passed, the activated first pass/fail signal PF1 is stored in the first pass/fail register 3300. The control logic 3200 subsequently deactivates the first selection signal P1SEL in response to the activated first pass/fail signal PF1 stored in the first pass/fail register 3300. Thus, the erase operation of the first plane 3100a will not be executed any more. That is, the erase operation of the first plane may be deemed to be completed.

In a step S660, the erase operation of the erase-failed plane is executed. The erase operation of the second plane 3100b may be executed because it is assumed that the second plane 3100b is erase-failed. For example, the bit lines of the second plane 3100b may be floated. An erase voltage, that is, a ground voltage may be applied to the word lines of the second plane 3100b. A bulk voltage, that is, a high voltage may be supplied to a bulk area of the second plane 3100b. That is, the erase operation of the second plane 3100b will be continued, even though the erase operation of the first plane 3100a is completed.

In a step S670, it is determined whether all planes are erase-passed. For example, it is determined whether both the first and the second planes 3100a and 3100b are erase-passed. It is assumed that the first plane 3100a is erase-passed in the step S640. Thus, if the second plane 3100b is erase-passed, the multi-plane erase operation may be deemed to be completed. If the second plane 3100b is erase-failed, the erase operation of the second plane 3100b can be executed in the step S660. The steps S660 and S670 may be repeated until the second plane 3100b is erase-passed. That is, the erase operation of the second plane 3100b will be executed repeatedly until the second plane 3100b will be erase-passed. That is, the erase operation of the second plane 3100b may be continued.

When the second plane 3100b is erase-passed, the second plane 3100b can activate the second pass/fail signal PF2. The activated second pass/fail signal PF2 is stored into the second pass/fail register 3400. When the first and second pass/fail signals PF1 and PF2 are activated, the control logic 3200 can complete the multi-plane erase operation.

As described above, the flash memory device 3000 according to an exemplary embodiment of the present invention executes the multi-plane erase operation of the first and second planes 3100a and 3100b. When the first plane 3100a is erase-passed prior to the second plane 3100b, the first plane 3100a is deactivated. The erase operation of the second plane 3100b is repeated until the second plane 3100b is deemed to be erase-passed. That is, the first plane 3100a is deactivated while the second plane 3100b is erased. Thus, disturbances due to an erase voltage and a bulk voltage are prevented in the erase-passed first plane 3100a, while the erase operation is executed in the second plane 3100b. Thus, reliabilities of the flash memory device 3000 are advanced.

In the exemplary embodiments described above, it is assumed that the first plane 3100a is erase-passed before the second plane 3100b is erase-passed. It may be understood, however, that the first and second planes 3100a and 3100b can be erase-passed simultaneously. In this case, the erase operations of the first and second planes 3100a and 3100b can be completed simultaneously.

The program operation and the erase operation of the flash memory device 3000 in FIG. 12 are now described referring to FIGS. 13 and 14. Operations of the flash memory device 3000 according to the exemplary embodiments of the present invention, however, are not limited by the terms "program operation" and "erase operation". For example, the erase operation may indicate an operation in which memory cells of the first and second planes 3100a and 3100b are adjusted to an erase state. That is, it will be understood that the program operation can include the erase operation.

For example, it may be understood that the flash memory device 1000 described referring to FIGS. 1 to 10 can be configured to interrupt an erase voltage and/or a bulk voltage during the erase operation.

The flash memory device 3000 including the first and second planes 3100a and 3100b is described referring to FIGS. 12 to 14. The flash memory device 3000, however, is not limited to a device including just two planes. For example, the flash memory device 3000 may include two or more planes as described referring to FIGS. 1 to 10.

Figure 15:
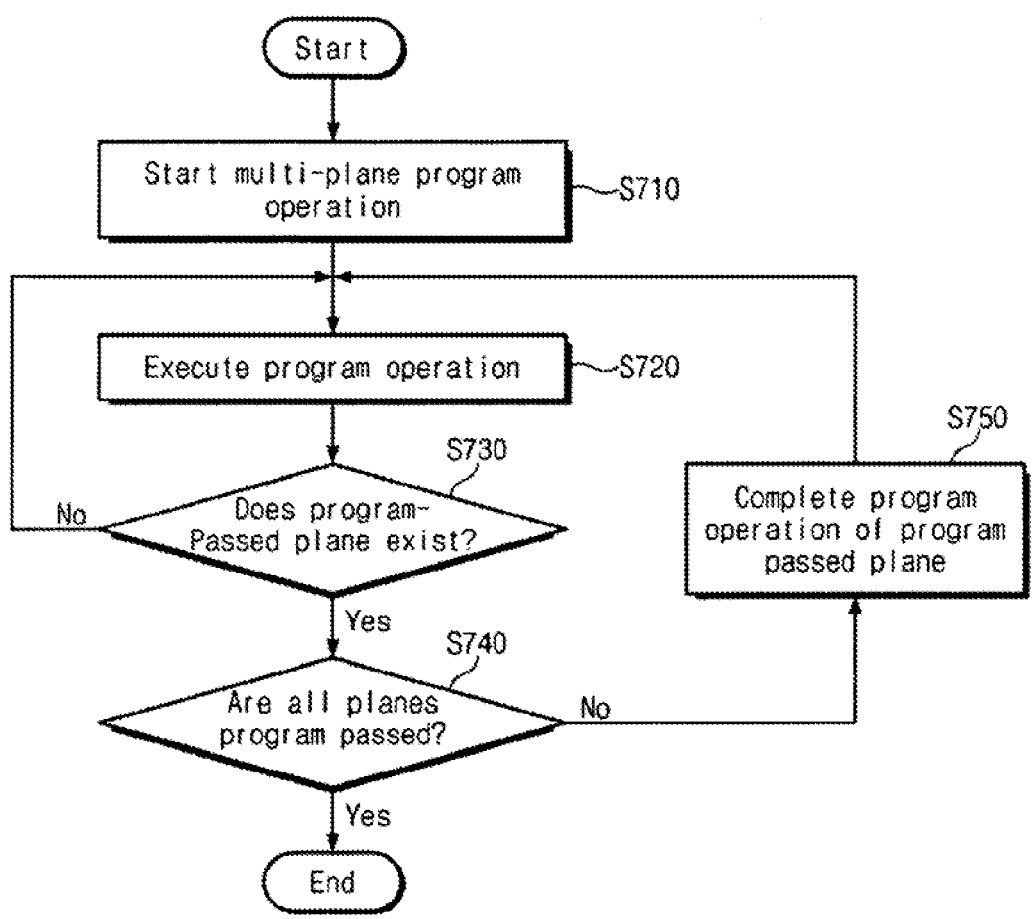
FIG. 15 is a flow chart for describing a program operation of the flash memory device 1000 or 3000 including a plurality of planes.

FIG. 15 is a flow chart describing a program operation of the flash memory device 1000 or 3000, which includes a plurality of planes. Referring to FIG. 15, in a step S710, the multi-plane program operation is started. For example, as described referring to the step S510 in FIG. 13, addresses and data may be provided to selected planes for the multi-plane program operation. In another example, as described referring to the step S610 in FIG. 14, addresses are received for selected planes for the multi-plane erase operation.

In a step S720, the program operation is executed. The program operation executed in the step S720 may include the erase operation.

In a step S730, it is determined whether a program-passed plane exists. If a program-passed plane does not exist, the program operation is executed once again in the step S720. That is, the program operation is repeated until at least one program-passed plane exists. If the program-passed plane exists, a step S740 is executed.

In the step S740, it is determined whether all planes are program-passed. If all planes are program-passed, the multi-plane program operation is completed. If at least one plane is program-failed, a step S750 is executed.

In the step S750, the program operation of the program-passed plane is completed. For example, as described referring to FIGS. 13 and 14, the program-passed plane may be deactivated. In another example, as described referring to FIGS. 1 to 10, the provision of a program, pass, or high voltage to the program-passed plane may be interrupted. Then, in the step S720, the program operation is executed.

The program operation of the program-passed plane is completed in the step S750. Thus, the program operation of the program-passed planes need not be executed once again in step S720. The program operation of the program-failed plane may not be completed is the step S750. Thus, the program operation of the program-failed plane may be executed once again in the step S720. That is, the program operation of the program-passed plane is completed, and the program operation of the program-failed plane is continued. The steps S720 to S750 may be repeated until all planes will be determined to be program-passed. That is, the program operation of the program-failed plane is repeated until all planes will be program-passed.

As described above, the flash memory device 1000 or 3000 according to exemplary embodiments of the present invention executes the multi-plane program operation. The program operation of the program-passed plane is completed, and the program operation of the program-failed plane is continued. Thus, disturbances in the program-passed plane are prevented. Thus, reliabilities of the flash memory device 1000 or 3000 are advanced.

Figure 16:
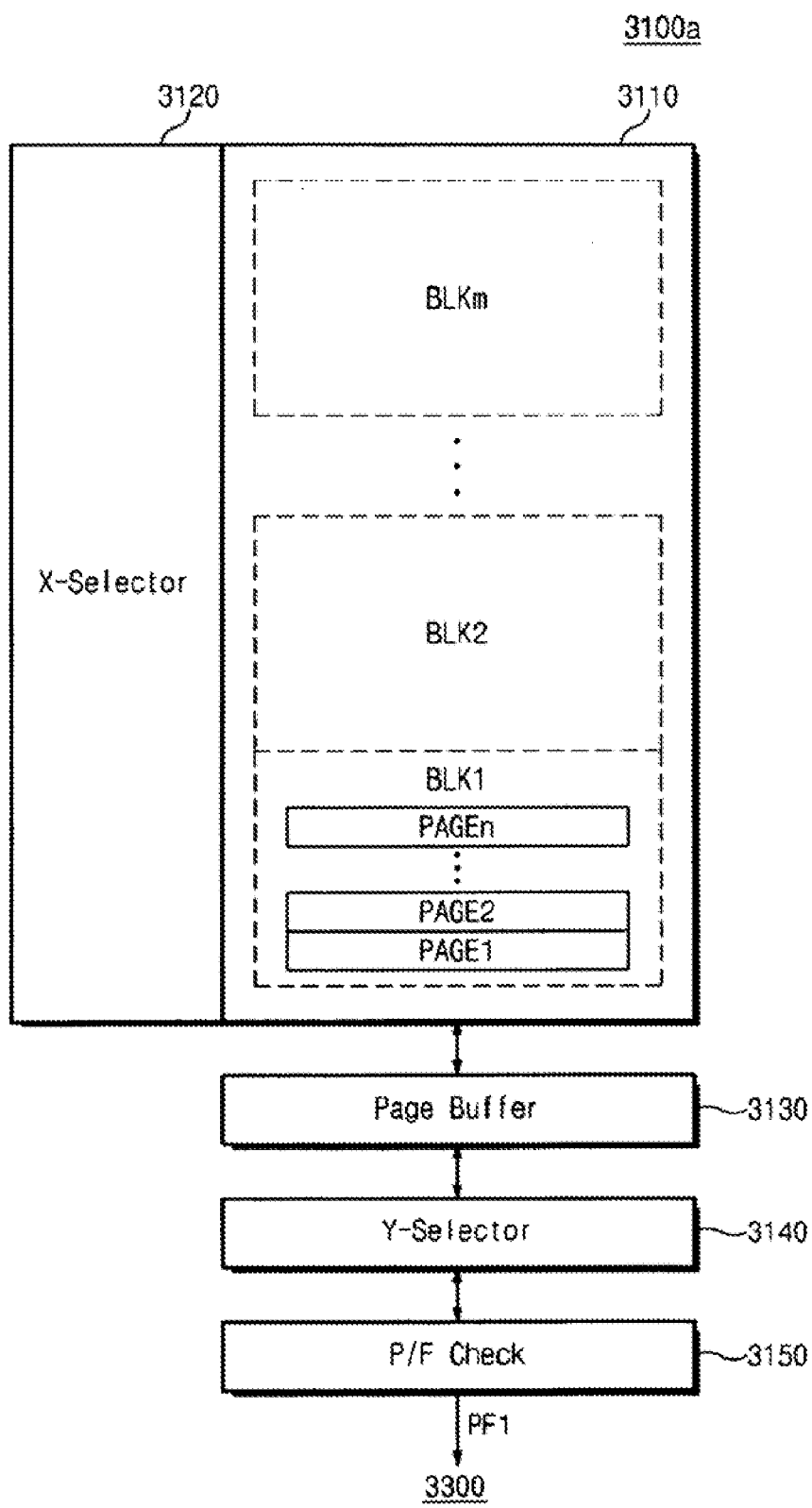
FIG. 16 is a block diagram illustrating the first plane in FIG. 12.

FIG. 16 is a block diagram illustrating the first plane 3100a shown in FIG. 12. The second plane 3100b in FIG. 12 has a structure identical to the first plane 3100a. Thus, descriptions of the second plane 3100b are omitted in the interest of brevity.

Referring to FIG. 16, the first plane 3100a includes a memory cell array 3110, a row selector circuit 3120, a page buffer circuit 3130, a column selector circuit 3140 and a pass/fail check circuit 3150.

The memory cell array 3110 is divided into a plurality of memory blocks BLK1, BLK2, . . . BLKm. Each memory block includes a plurality of pages. For example, in FIG. 16, there is illustrated the first memory block BLK1 that includes first to n-th pages PAGE1, PAGE 2, . . . PAGEn. All of the memory blocks BLK1 to BLKm may have the same structure. Furthermore, both the i-th memory block BLKi (not shown) of the first plane 3100a and the i-th memory block BLKi (not shown) of the second plane 3100b, for example, may be programmed simultaneously in the multi-plane program operation. Furthermore, both the j-th page PAGEj (not shown) of the i-th memory block BLKi of the first plane 3100a and the j-th page PAGEj of the i-th memory block BLKi (not shown) of the second plane 3100b, for example, may be programmed simultaneously in the multi-plane program operation.

The row selector circuit 3120, the page buffer circuit 3130, the column selector circuit 3140, and the pass/fail check circuit 3150 may be configured to operate the same as the row selector circuit 120, the page buffer circuit 130, the column selector circuit 140 and the pass/fail check circuit 150 described hereinabove relative to FIGS. 1 to 10.

The row selector circuit 3120, the page buffer circuit 3130, the column selector circuit 3140, and the pass/fail check circuit 3150 may be configured to operate in response to a control of the control logic 3200. The row selector circuit 3120, the page buffer circuit 3130, the column selector circuit 3140, and the pass/fail check circuit 3150 may be configured to operate in response to the first selection signal P1SEL described hereinabove relative to FIGS. 11 to 15.

In an example, the row selector circuit 3120, the page buffer circuit 3130, the column selector circuit 3140, and the pass/fail check circuit 3150 are configured to receive control signals (not shown) and the first selection signal P1SEL from the control logic 3200. When the first selection signal P1SEL is active, the row selector circuit 3120, the page buffer circuit 3130, the column selector circuit 3140, and the pass/fail check circuit 3150 operate normally in response to the control signals. When the first selection signal P1SEL is inactive, the row selector circuit 3120, the page buffer circuit 3130, the column selector circuit 3140, and the pass/fail check circuit 3150 may be inactive, regardless of the other control signals from the control logic 3200.

For example, the control logic 3200 may provide a control signal for controlling the row selector circuit 3120, and the control signal may be inputted to an AND logic circuit (not shown) with the first selection signal P1SEL. An output of the AND logic circuit may be used as a control signal for controlling the row selector circuit 3120. That is, when the first selection signal P1SEL is activated, a control signal from the control logic 3200 may be transferred to the row selector circuit 3120. When the first selection signal P1SEL is deactivated, a control signal will not be transferred to the row selector circuit from the control logic 3200.

Similarly, the control logic 3200 may provide control signals for controlling the page buffer circuit 3130, the column selector circuit 3140 and the pass/fail check circuit 3150, and the control signals may be respectively inputted to AND logic circuits with the first selection signal P1SEL. Outputs from the AND logic circuit may be used as control signals for controlling the page buffer circuit 3130, the column selector circuit 3140, and the pass/fail check circuit 3150 respectively.

Figure 17:
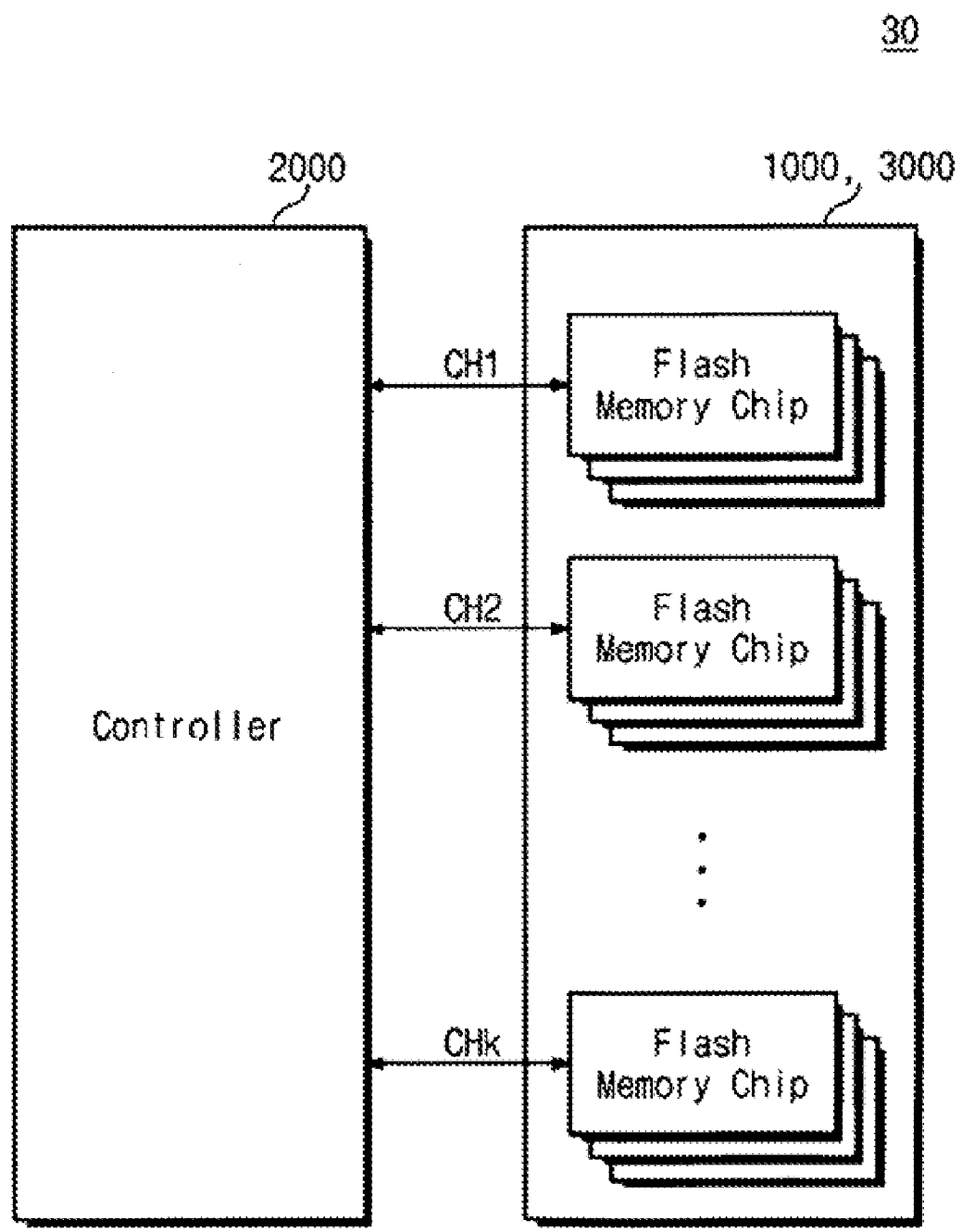
FIG. 17 is a block diagram illustrating a memory system which is another embodiment of the memory system.

FIG. 17 is a block diagram illustrating a memory system 30 that is another embodiment of the memory system 10 shown in FIG. 11. Referring to the FIG. 16, the memory system 30 includes the flash memory device 1000 or 3000 and the controller 2000.

The flash memory device 1000 or 3000 includes a plurality of flash memory chips. The plurality of flash memory chips is divided into a plurality of chip groups, each of which comprises a channel used to communicate with the controller 2000. In FIG. 17, there is illustrated the plurality of flash memory chips that comprises first to k-th channels CH1 to CHk, respectively. The flash memory device 1000 or 3000 may be configured to operate the same as described hereinabove relative to FIGS. 1 to 16.

The controller 2000 is configured to communicate with the flash memory device 1000 or 3000 via the first to k-th channels CH1 to CHk. The controller 2000 may be configured to operate the same as described hereinabove relative to FIG. 11. The controller 2000 is described more particularly referring to FIG. 19.

For example, as described hereinabove relative to FIG. 11, it will be understood that the flash memory device 1000 or 3000 and the controller 2000 can comprise a memory card or an SSD. It also will be understood that the flash memory device 1000 or 3000 and the controller 2000 can be an element of one of various electronic devices.

Figure 18:
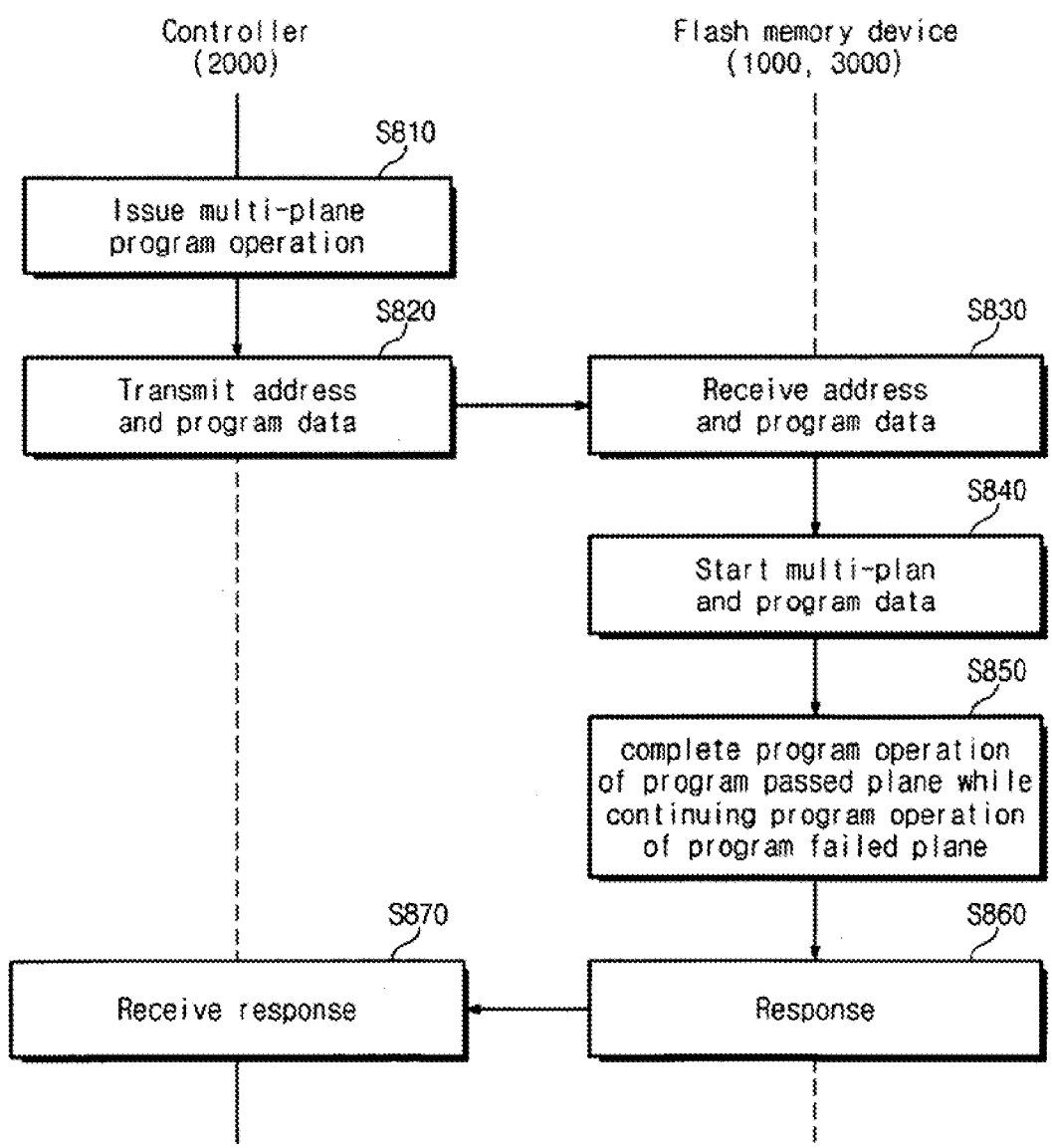
FIG. 18 is a flow chart for describing the memory systems in FIGS. 11 and 17.

FIG. 18 is a flow chart for describing the memory systems 10 and 30 in FIGS. 11 and 17, respectively. Referring to FIG. 18, in a step S810, the controller 2000 issues the multi-plane program operation. For example, the controller 2000 may issue the multi-plane program operation in response to a request from a host (not shown).

In a step S820, the controller 2000 transmits addresses and data. For example, the addresses and data may be received from a host (not shown). The addresses and data may correspond to planes to be selected at the multi-plane program operation. For example, when p planes are selected for the multi-plane program operation, the controller 2000 can transmit the addresses and data that correspond to the p planes, respectively.

In a step S830, the flash memory device 1000 or 3000 receives the addresses and data from the controller 2000. In a step S840, the flash memory device 1000 or 3000 starts the multi-plane program operation.

In a step S850, the flash memory device 1000 or 3000 completes the program operation of the program-passed plane, while the program operation of the program-failed plane is continued. For example, the flash memory device 1000 or 3000 may execute the program operation as described hereinabove relative to FIGS. 1 to 17. When all planes are program-passed, the multi-plane program operation is completed.

In a step S850, the flash memory device 1000 or 3000 transmits to the controller 2000 a response signal indicating that the multi-plane program operation is completed. For example, the flash memory device 1000 or 3000 transmits the response signal by activating or deactivating a ready/busy signal.

In a step S870, the controller 2000 receives the response signal generated in a step S860 from the flash memory device 1000 or 3000. Then, the controller 2000 can access the flash memory device 1000 or 3000.

As described referring to FIGS. 1 to 18, during the multi-plane program operation, the program-passed plane is deactivated or the provision of power to the program-passed plane is interrupted. Thus, power consumption of the flash memory device 1000 or 3000 may be reduced.

In an example, power for operating the flash memory device 1000 or 3000 is supplied from the controller 2000. Thus, it may be understood that power consumption of the memory systems 10 and 30 is reduced.

Figure 19:
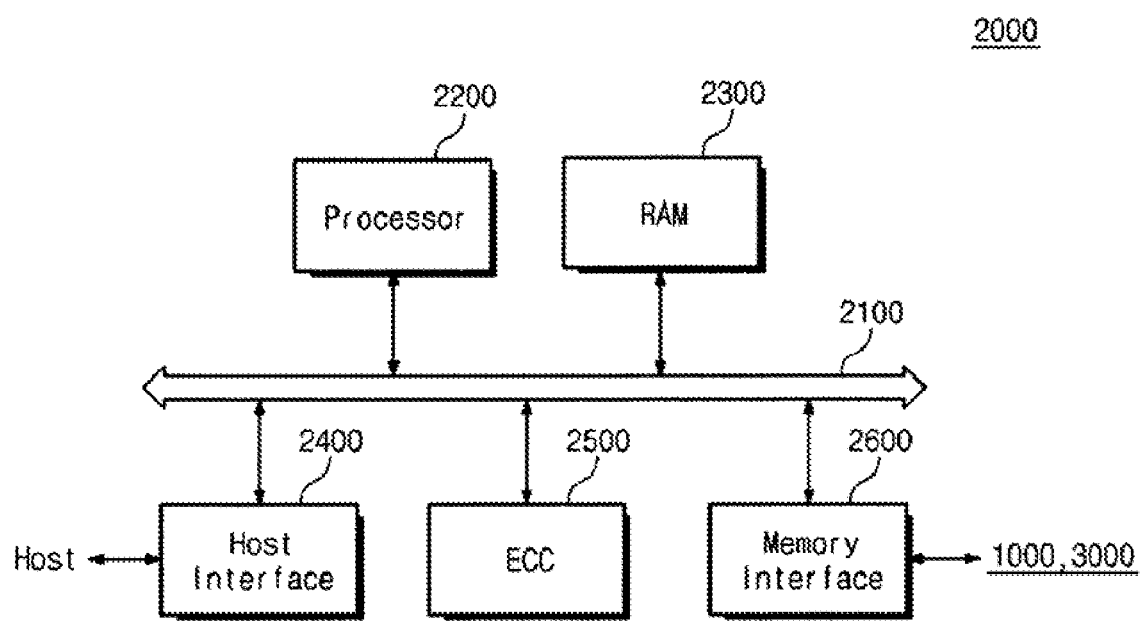
FIG. 19 is a block diagram illustrating the controller in FIGS. 11 and 17.

FIG. 19 is a block diagram of the controller 2000 shown in FIGS. 11 and 17. Referring to FIG. 19, the controller 2000 includes a system bus 2100, a processor 2200, a RAM 2300, a host interface 2400, an error correcting block 2500, and a memory interface 2600.

The system bus 2100 provides communication channels between the various elements of the controller 2000. The processor 2200 is configured to control various operations of the controller 2000. More specifically, the processor 2200 is configured to control operations of the flash memory device 1000 or 3000. The processor 2200 is configured to drive firmware for controlling the controller 2000 and the flash memory device 1000 or 3000. For example, the processor 2200 is configured to drive a flash translation layer (FTL), a host driver, and the like.

The RAM 2300 is used as a work, or operating, memory of the controller 2000. For example, the processor 2200 is configured to drive the firmware using the RAM 2300. In another example, the RAM 2300 may be used as a buffer memory between the host (not shown) and the flash memory device 1000 or 3000.

The host interface 2400 includes a protocol for communicating with the host. For example, the host interface 2400 is configured to communicate with the host using one of various protocols such as a USB, a MMC, a PCI, a PCI-E, an ATA, a SATA, a PATA, a SCSI, an ESDI, an IDE, an EIDE, and the like.

The error correcting block 2500 is configured to generate parities of data to be transmitted to the host or the flash memory device 1000 or 3000. The generated parities are transferred to the flash memory device 1000 or 3000 with corresponding data. When data is received from the flash memory device 1000 or 3000, corresponding parities are received together. The error correcting block 2500 is configured to detect and correct errors of the received data using the received parities.

The error correcting block 2500 includes an error control code (ECC) for detecting and correcting errors. For example, the ECC includes a cyclic redundancy check code (CRC code), a Bose, Chaudhuri, and Hocquenghem code (BCH code), a Reed-Solomon code (RS code), and the like.

The memory interface 2600 includes a protocol for communicating with the flash memory device 1000 or 3000. For example, the memory interface 2600 may include a NAND protocol.

Figure 20:
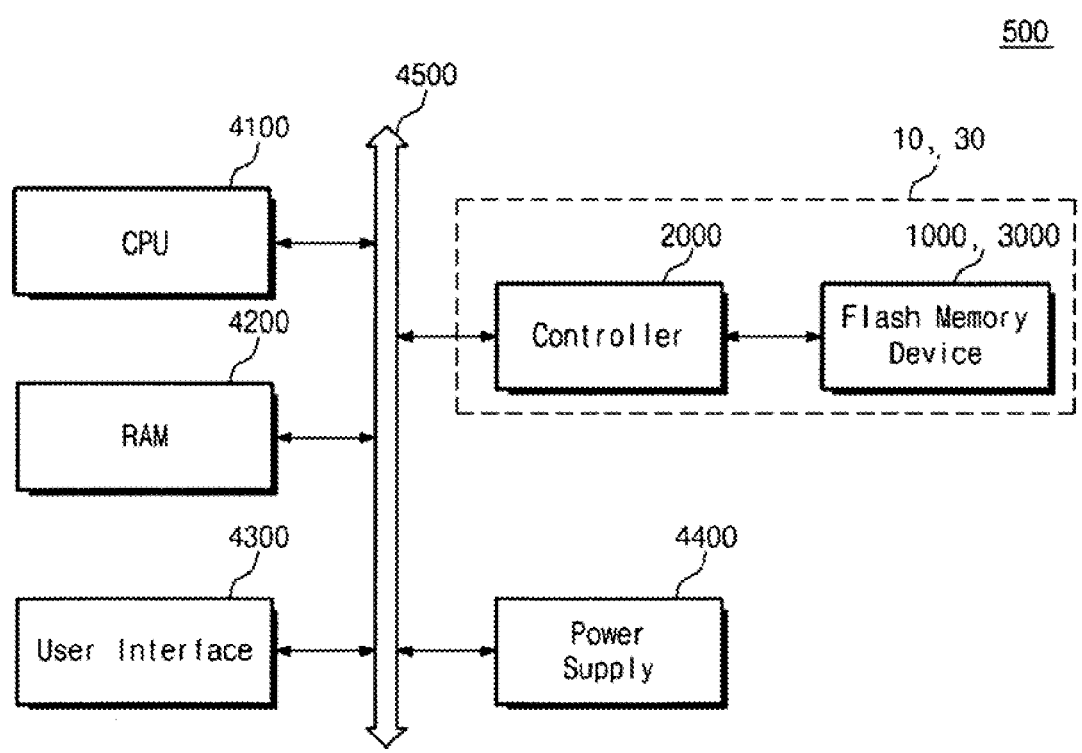
FIG. 20 is a block diagram illustrating a computing system including the memory system in FIG. 11 or 17.

FIG. 20 is a block diagram illustrating a computing system 500 including the memory system 10 or 30 in FIG. 11 or 17, respectively. Referring to FIG. 20, the computing system 500 according to an exemplary embodiment of the present invention includes a central processing unit 4100 (CPU), a RAM 4200, a user interface 4300, a power supply 4400, and the memory system 10 or 30.

The memory system 10 or 30 is electrically connected with the CPU 4100, the RAM 4200, the user interface 4300, and the power supply 4400 via the system bus 4500. Data provided through the user interface 4300 or processed by the CPU 4100 is stored into the memory system 10 or 30. The memory system 10 or 30 includes the controller 2000 and the flash memory device 1000 or 3000.

When the memory system 10 or 30 is embedded as an SSD, a booting speed of the computing system 4000 can be advanced extremely. Even though not shown in FIG. 20, it may be understood to one having ordinary skill in the related art that the memory system 10 or 30 may further include elements, such as an application chipset, camera image processor, and the like.

As described above, according to exemplary embodiments of the present invention, the program operation of the program-passed plane is completed. That is, disturbances due to a program voltage, for example, a program voltage, a pass voltage, a high voltage, an erase voltage, and the like, to the program-passed plane are prevented. If disturbances are prevented, distributions of the threshold voltages of the memory cells may be reduced. Thus, according to the exemplary embodiments of the present invention, errors are reduced at a read operation. That is, it will be understood that an error correcting capability of the flash memory device 1000 or 3000 is advanced.

When a cell-per-bit number increases, margins between logic states programmed into the memory cells decrease. That is, when the number of bits stored per memory cell increases, disturbances may be increased. According to exemplary embodiments of the present invention, disturbances in the program-passed plane are prevented. Thus, it will be understood that the effects of the exemplary embodiments of the present invention increase when the number of bits stored per memory cell increases.

According to exemplary embodiments of the present invention, the program operation of the program-passed plane is completed. That is, a program voltage, for example, a program voltage, a pass voltage, a high voltage, an erase voltage, and the like, is not supplied to the program-passed plane. Thus, power consumption is reduced during the program operation.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of programming a flash memory device that includes a plurality of planes having a memory cell array formed of memory cells arranged in rows and columns, comprising:
  programming the plurality of planes of the flash memory device by simultaneously applying a program voltage to the plurality of planes;
  verify reading the plurality of planes to detect a program-passed plane and a program-failed plane; and
  interrupting a programming of the program-passed plane by preventing the program voltage from being applied to the program-passed plane and continuing a programming of the program-failed plane by applying the program voltage to the program-failed plane,
  wherein first applications of the program voltage to the plurality of planes are performed simultaneously.

2. The method of claim 1, wherein levels of the program voltage applied to the plurality of planes simultaneously are the same.

3. A method of programming a flash memory device that includes a plurality of planes having a memory cell array formed of memory cells arranged in rows and columns, comprising:
  programming a plurality of planes of the flash memory device by simultaneously applying a program voltage to the plurality of planes;
  verify reading the plurality of planes to detect a program-passed plane and a program-failed plane; and
  interrupting a programming of the program-passed plane by preventing the program voltage from being applied to the program-passed plane and continuing a programming of the program-failed plane by applying the program voltage to the program-failed plane, wherein the program voltage is applied to each plane of the plurality of planes by driving a high voltage; applying the high voltage to pass transistors of each plane to turn-on the pass transistors; and transferring the program voltage through the turned-on pass transistors to each plane,
  wherein first applications of the program voltage to the plurality of planes are performed simultaneously.

4. A method of programming a flash memory device that includes a plurality of planes having a memory cell array formed of memory cells arranged in rows and columns, comprising:
  programming a plurality of planes of the flash memory device by simultaneously applying a program voltage to the plurality of planes;
  verify reading the plurality of planes to detect a program-passed plane and a program-failed plane; and
  interrupting a programming of the program-passed plane by preventing the program voltage from being applied to the program-passed plane and continuing a programming of the program-failed plane by applying the program voltage to the program-failed plane,
  wherein the program voltage is applied to each plane of the plurality of planes by driving a high voltage; applying the high voltage to pass transistors of each plane to turn-on the pass transistors; and transferring the program voltage through the turned-on pass transistors to each plane,
  wherein the programming of the program-passed plane is interrupted by preventing the driving the high voltage,
  wherein first applications of the program voltage to the plurality of planes are performed simultaneously.

5. The method of claim 4, wherein the programming of the program-passed plane is interrupted by preventing the applying the high voltage in addition to the preventing the driving the high voltage.

6. The method of claim 4, wherein the programming of the program-passed plane is interrupted by preventing the transferring the program voltage in addition to the preventing the driving the high voltage.

7. The method of claim 4, wherein levels of the program voltage applied to the plurality of planes simultaneously are the same.

8. The method of claim 4, wherein further comprising:
  loading program data to the plurality of planes before the programming the plurality of planes.

9. the method of claim 4, wherein the driving the high voltage, the applying the high voltage and the transferring the program voltage are performed simultaneously.

* * * * *